(12) United States Patent
Futsuhara

(10) Patent No.: US 6,272,001 B1
(45) Date of Patent: Aug. 7, 2001

(54) EMERGENCY STOP SWITCH AND EMERGENCY STOP SWITCH CIRCUIT

(75) Inventor: Koichi Futsuhara, Urawa (JP)

(73) Assignee: The Nippon Signal Co., Ltd., Tokyo (JP)

( * ) Notice: Subject to any disclaimer, the term of this patent is extended or adjusted under 35 U.S.C. 154(b) by 0 days.

(21) Appl. No.: 09/155,859

(22) PCT Filed: May 23, 1997

(86) PCT No.: PCT/JP97/01737

§ 371 Date: Aug. 9, 1999

§ 102(e) Date: Aug. 9, 1999

(87) PCT Pub. No.: WO98/36436

PCT Pub. Date: Aug. 20, 1998

(30) Foreign Application Priority Data

Feb. 14, 1997 (JP) .................................................. 9-030112

(51) Int. Cl.[7] .................................................. H01H 47/00
(52) U.S. Cl. .................................................. 361/170; 361/115
(58) Field of Search .................................................. 361/170, 115, 361/160

(56) References Cited

U.S. PATENT DOCUMENTS

| 4,847,570 | * | 7/1989 | Schramm | 331/65 |
| 5,263,570 | | 11/1993 | Stonemark | 198/502.1 |

FOREIGN PATENT DOCUMENTS

| 19 28 294 | 2/1970 | (DE) . | |
| 15 37 278 | 6/1970 | (DE) . | |
| 50-4622 | 1/1975 | (JP) | H01H/13/00 |
| 51-8114 | 3/1976 | (JP) | H01H/13/00 |
| 9-147662 | 6/1997 | (JP) | H01H/13/00 |
| 94/23303 | 10/1994 | (WO) | H02P/5/00 |

* cited by examiner

*Primary Examiner*—Stephen W. Jackson
(74) *Attorney, Agent, or Firm*—McDermott, Will & Emery

(57) ABSTRACT

A transformer structured emergency stop switch (10) incorporates a first core member (14) wound with primary and secondary windings, and a second core member (15) which at normal times contacts with the first core member (14) under spring force and in an emergency is separated therefrom by a push button (16). Several transformer structured emergency stop switches (10) are connected in series to make up an emergency stop switch circuit.

14 Claims, 17 Drawing Sheets

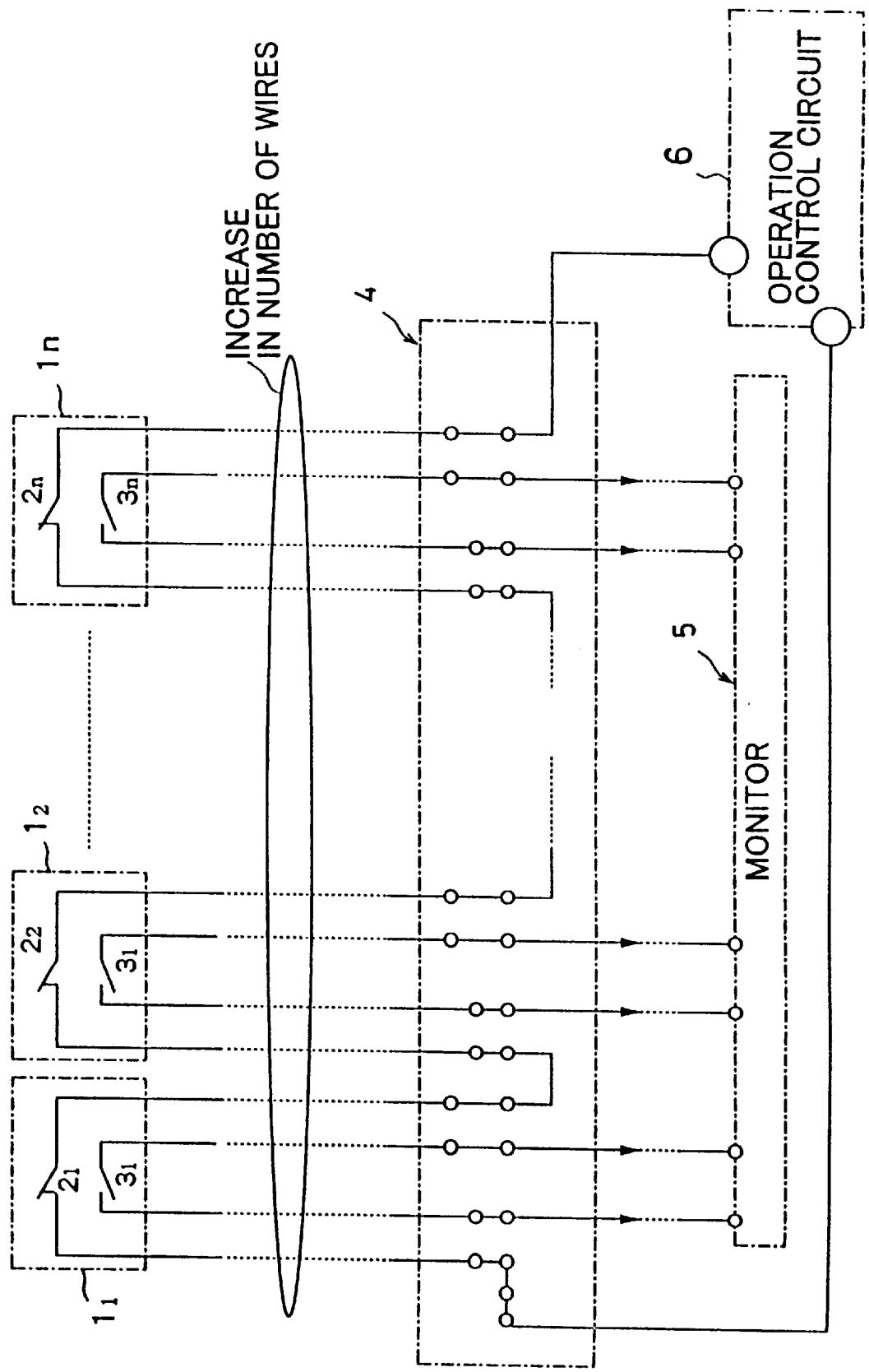

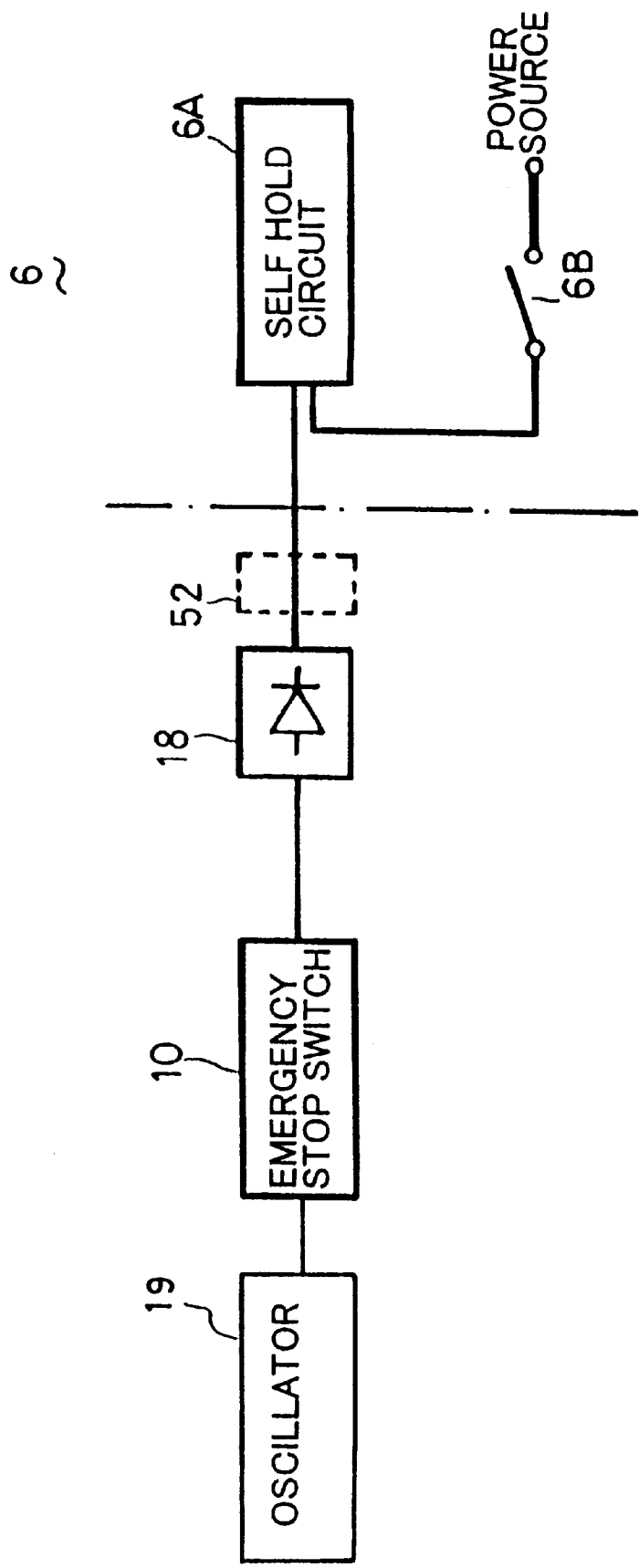

EMERGENCY STOP SWITCH AND EMERGENCY STOP SWITCH CIRCUIT

TECHNICAL FIELD

The present invention relates to an emergency stop switch and to an emergency stop switch circuit provided for shutting off the operation output from machinery at the time of an emergency to thereby ensure the safety of an operator.

BACKGROUND ART

In factories and the like where industrial machinery is installed, in order to ensure the safety of an operator in cases such as where a fault occurs during operation of machinery, an emergency stop switch for emergency stop of the machinery is necessarily provided.

Heretofore, such an emergency stop switch incorporates; a first switch section provided with normally closed contact points which are normally on and which are switched off by push button operation at the time of an emergency, and a second switch section provided with normally open contact points which are normally off and which are switched on by operation of the push button at the time of an emergency, and the first and second switch sections are operated linked together. At normal times, the normally closed contact points of the first switch section are switched on by spring force, and the normally open contact points of the second switch section are switched off by spring force. The construction is such that when at the time of an emergency the push button is operated, the normally closed contact points of the first switch section go off, and the normally open contact points of the second switch section come on.

Here, the normally closed contact points output from the first switch section is generally used as a reset input to a self hold circuit provided in the operating control circuit for the machinery. That is to say, if the normally closed contact points are once switched off, the self hold circuit is reset, so that after this, provided that a trigger input signal is not input to the self hold circuit by some other separate means, then, even if the normally closed contact points of the first switch section are again switched on by spring force, an output from the self hold circuit is not produced. Recently, there is also the case where this is managed by simply inputting to a monitor.

This type of emergency stop switch is installed at each work site in a factory, and has heretofore been wired as shown in FIG. 1.

That is to say, respective first switch portions $2_1$~2n of a plurality of emergency stop switches $1_1$~$1_n$ are connected in series to a machinery operation control circuit 6 via a relay terminal assembly 4. Furthermore, respective second switch sections $3_1$~$3_n$ are separately connected to a monitor 5 via the relay terminal assembly 4. These emergency stop switches $1_1$~$_n$ are installed at each respective work site in a factory.

Consequently, in the case where none of the emergency stop switches $1_1$~$1_n$ are operated, the operation control circuit 6 generates an operation output for the machinery as normal. However if any one of the emergency stop switches $1_1$~$1_n$ is operated, then the relevant first switch section switches off so that the operation output from the operation control circuit 6 stops. At the same time, the second switch section of the operated emergency stop switch switches on so that the work site where the emergency stop switch is operated is shown on the monitor 5, enabling the work site where the emergency situation occurred to be made known.

However, with the conventional emergency stop switch, due to the construction using electric contact points, there is the possibility of a contact point fusion fault occurring. Since the emergency stop switch is only used in the case where an emergency situation arises, and is thus not frequently operated, monitoring to determine if it will operate normally is difficult. Moreover, even if inspected individually, since there is a large number disposed within a factory, then the time taken is considerable. Therefore, there is the danger that contact point fusion faults can be overlooked, and if the normally closed contact points of the first switch section have a fusion fault, then even if the push button is operated, the operation output for the machinery cannot be stopped, thus posing a problem from the point of ensuring operator safety.

Moreover, the work site where the emergency stop switch circuit as shown in FIG. 1 with emergency stop switches severally connected is installed, and the machinery operation control side where the operation control circuit 6, the relay terminal assembly 4 and the monitor 5 and so on are installed, are detached from each other. Hence in the case of a switch circuit which utilizes emergency stop switches using conventional electrical contact points, then as shown in FIG. 1, it is necessary for the respective emergency stop switches $1_1$~$1_n$ installed at the respective work sites to be connected in series via the relay terminal assembly 4, and also the location of all of the emergency stop switches $1_{1-1n}$ must be notified individually to the monitor 5 via the relay terminal assembly 4. Therefore, there is the problem that the number of wires for connecting between the emergency stop switches $1_1$~$1_n$ and the relay terminal assembly 4 is considerable.

The present invention takes into consideration the above situation, with the object of providing an emergency stop switch having no contact points so that there is no possibility of contact point fusion faults. Moreover, it is an object to provide an emergency stop switch circuit which does not incur an increase in wiring even in the case where a switch circuit connected to a plurality of emergency stop switches is installed. Furthermore, it is an object to provide an emergency stop switch circuit wherein monitoring for normalcy of the respective emergency stop switches is facilitated.

DISCLOSURE OF THE INVENTION

According to the present invention, an emergency stop switch comprises: a first core member secured to a fixed body and wound with a primary winding and a secondary winding; a second core member provided so as to be movable towards and away from the first core member; and a moving device for moving the second core member, the construction being such that when the second core member is made to approach the first core member by the moving device, a transformer is formed by the first and second core members so that an AC signal from an AC signal generating source connected to the primary winding side is transmitted to the secondary winding side, and when the second core member is separated from the first core member by the moving device, the AC signal is not transmitted to the secondary winding side.

With such a construction, at normal times where a push button is not pushed, the second core member is made to approach the first core member by a resilient member, so that a closed magnetic circuit is created by the first and second core members to thus form a transformer. Consequently, the AC signal applied to the primary winding from the AC signal generating source is transmitted to the secondary winding side. On the other hand, if an emergency situation arises and the push button is pushed, then the second core member is separated from the first core member against the resilient urging force of the resilient member, and hence the magnetic path is no longer formed and the output level from the second winding side drops considerably or becomes zero, and the operation output to the machinery is shut off. Moreover, since there are no electrical contact points, the possibility of a contact point fusion fault does not arise.

More specifically, the moving device comprises; a push button with one end fixed to the second core member, and a resilient member for resiliently urging the second core member in an opposite direction to the push operation direction of the push button, the construction being such that at normal times, the second core member is made to approach the first core member by the resilient urging force of the resilient member to form a transformer, and when the push button is pushed, the second core member separates from the first core member against the resilient urging force of the resilient member.

Moreover, the construction may be such that the moving device is an opening and closing door which is attached to a fixed safety fence, and when the door is closed, the second core member approaches the first core member which is fixed to the safety fence side to form a transformer, and when the door is opened, the second core member is separated from the first core member.

With such a construction, if machinery is housed within the safety fence, then if the door is opened, the machinery stops. Therefore safety of an operator approaching the machinery can be reliably ensured.

Furthermore, the construction may be such that the moving device comprises; a rope with one end secured to the second core member and the other end secured to a fixed part, and a resilient member for resiliently urging the second core member in a direction opposite to the pulling direction of the rope, the construction being such that at normal times, the second core member is made to approach the first core member by the resilient urging force of the resilient member to form a transformer, and when the rope is pulled, the second core member separates from the first core member against the resilient urging force of the resilient member.

With such a construction, if a rope is stretched across the boundary of a danger region around machinery which is dangerous should an operator enter therein and a safe region which is safe should an operator enter therein, then an operator who intends enter the danger region pulls on the rope to thereby stop the machinery.

With the emergency stop switch circuit of the present invention, the construction is such that a plurality of the emergency stop switches disclosed in claim 1 are connected in series, and an AC signal is supplied from an AC signal generating source to a primary winding side of a first stage emergency stop switch, and an output based on the AC signal is generated from a secondary winding side of a last stage emergency stop switch.

With such an emergency stop switch circuit, in the case where a plurality of emergency stop switches are provided, it is not necessary to connect these individually to the relay terminal assembly and hence the amount of wiring is greatly reduced.

The construction may be such that respective capacitors are connected in parallel between adjacent emergency stop switches, and a capacitance detection device for detecting capacitor capacitance is connected in parallel to an output end of the secondary winding side of the last stage emergency stop switch.

With such a construction, if any one of the emergency stop switches is operated, the capacitor capacitance observed from the capacitance detection device side changes. Hence based on the capacitance value detected by the capacitance detection device, it can be known which position emergency stop switch has been operated, making it possible to know the work site where the emergency situation has occurred.

If the capacitor is a four terminal capacitor, then at the time of a capacitor disconnection fault, the operation output for the machinery is stopped.

Furthermore, the construction may be such that respective resistors are connected in series between the adjacent emergency stop switches, and a level detection device is provided for detecting the level of the output signal from an output end of the last stage emergency stop switch, and when the level of the output signal exceeds a previously set threshold value level, the output from the level detection device is stopped.

With such a construction, in the case where for any cause, one of the emergency stop switches is short circuited, the output level of the output end changes and exceeds the previously set threshold value level of the level detection device. Hence it can be known that one of the emergency stop switches has short circuited.

The construction may be such that instead of resistors connected in series between the adjacent emergency stop switches, a tertiary winding is wound on the second core member of the respective emergency stop switches, and the resistors are connected in series to the tertiary winding.

Furthermore, the construction may be such that light emitting elements are respectively connected in series to at least the secondary winding sides of the respective emergency stop switches which are connected together in series.

With such a construction, if an abnormality occurs where a signal is not transmitted in one of the plurality of emergency stop switches from the input side to the output side, the light emitting element connected to the output side of the emergency stop switch in which the abnormality has occurred immediately goes off. Therefore, if respective light emitting elements are disposed close to the respective emergency stop switches, abnormalities of the emergency stop switches can be individually verified at a work site or the like.

For the connections of the light emitting elements, the construction may be such that a parallel circuit in which two light emitting elements are connected in parallel with their forward directions opposite to each other, is connected to the secondary winding side.

Furthermore, the construction may be such that one light emitting element is connected to the secondary winding side via a rectifying circuit.

In this case, it is not necessary to provide two light emitting elements.

Furthermore, the construction may comprise a warning sound generating circuit provided with an alarm device into which is input an output signal from a last stage emergency stop switch of an emergency stop switch circuit provided with light emitting elements, the alarm device generating a warning sound in an inaudible frequency range when an output signal is generated from the last stage emergency stop switch and a high level signal indicating safety is thus input, and generating a warning sound in an audible frequency range when the output signal is stopped and a low level signal indicating danger is thus input, and a monitoring circuit for continuously monitoring for the presence of a warning sound from the warning sound generating circuit.

With such a construction, in the case where an abnormality occurs in any of the emergency stop switches, the light emitting element for the site where the abnormality occurs goes off so that the abnormality can be known. Together with this, a warning sound of an audible frequency range which can be heard by a person is generated from the alarm device, to notify of the occurrence of an abnormality in the emergency stop switch. Furthermore, an abnormality in the alarm device is also monitored by the monitoring circuit, and if an abnormality occurs in the alarm device, this is notified by the monitoring circuit.

BRIEF DESCRIPTION OF THE DRAWINGS

FIG. 1 is an explanatory diagram of the wiring conditions of a conventional emergency stop switch;

FIG. 3 is a circuit diagram showing an example of connections of the emergency stop switch of FIG. 2 and an operating control circuit;

BEST MODE FOR CARRYING OUT THE INVENTION

As follows is a description of embodiments of emergency stop switches and emergency stop switch circuits according to the present invention, based on the drawings.

Figure 2A:
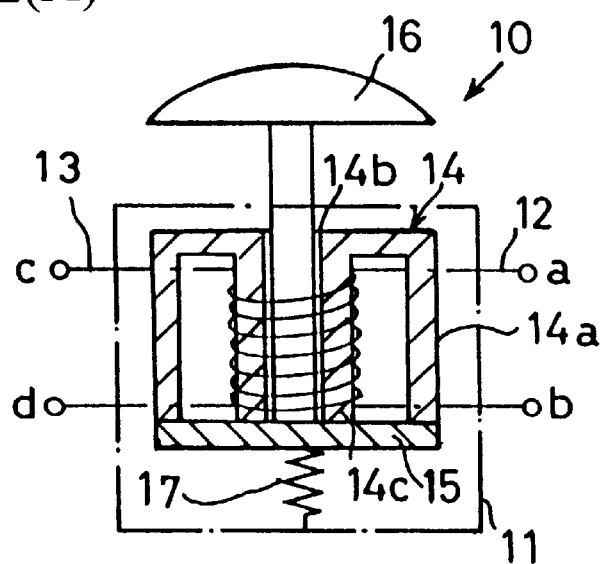
FIG. 2 is a schematic diagram showing a first embodiment of an emergency stop switch according to the present invention, FIG. 2 (A) being an overall view, and FIG. 2 (B) being a perspective view of a first core member.
Figure 2B:
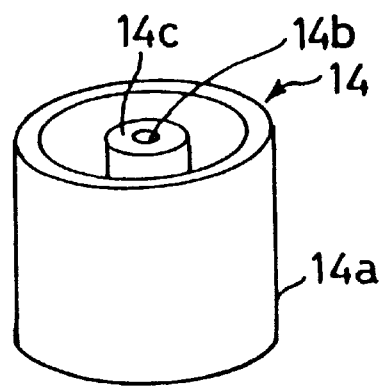

FIGS. 2 (A) and (B) show schematic diagrams of a first embodiment of an emergency stop switch according to the present invention.

In FIG. 2 (A), an emergency stop switch 10 comprises; a first core member 14 secured inside a case 11 and wound with a primary winding 12 and a secondary winding 13, a disc shape second core member 15 provided inside the case 11 so as to be movable towards and away from the first core member 14, which forms a closed magnetic circuit with the first core member 14 when in contact therewith to thereby form a transformer, a push button 16 with one end secured to the second core member 15 and the other end passing through a central portion of the first core member 14 and protruding outside the case with the protruding end formed as a button, and a spring 17 serving as a resilient member, disposed between a bottom portion of the second core member 15 and a wall face of the case 11 for resiliently urging the second core member 15 in an opposite direction (upward direction in the figure) to the push operation direction (downward direction in the figure) of the push button 16. The push button 16 and the spring 17 constitute a moving device.

The first core member 14 is formed as shown in FIG. 2 (B) with a cylindrical column 14c having a through hole 14b at a central portion of a cylindrical portion 14a which is open at one end. Around the periphery of the cylindrical column 14c is wound the primary winding 12 and the secondary winding 13, insulated from each other. FIG. 2 (B) shows the first core member 14 in an inverted condition to in FIG. 2 (A).

The push button 16 passes through the through hole 14b of the cylindrical column 14c of the first core member 14, and is secured to the second core member 15.

Next is a description of the operation of the emergency stop switch 10.

In the case where the emergency stop switch 10 is connected to the machinery operation control circuit 6 in FIG. 1, then as shown in FIG. 3 an oscillator 19 serving as an AC signal generating source is connected to terminals a, b on the primary winding 12 side of the emergency stop switch 10, and terminal c, d on the secondary winding 13 side are connected to for example an emergency stop line of the operation control circuit 6 via a rectifying circuit 18. The emergency stop line is connected for example to a reset input terminal (also referred to as a hold input terminal) of a self hold circuit 6A inside the operation control circuit 6. A power source is connected to a trigger input terminal of the self hold circuit 6A via a machinery operating switch 6B. Consequently, with the self hold circuit 6A, when the operating switch 6B is switched on with the reset input signal being input from the emergency stop switch circuit via the emergency stop line, then the trigger input signal from the operating switch 6B is self held so that the output continues. If the before mentioned reset input signal from the emergency stop line once stops, then the self hold function is cancelled, so that provided the operating switch 6B is not again switched on, an output will not be produced.

In such a connection condition, at normal times the second core member 15 is contacted with the first core member 14 under the resilient urging force of the spring 17, thus forming a closed magnetic circuit and making up a transformer, so that the AC current from the oscillator 19 which is supplied to the primary winding 12 is transmitted to the secondary winding 13 side and thus supplied to the operation control circuit 6. As a result, a reset input signal is applied to the self hold circuit 6A inside the operation control circuit 6 via the emergency stop line, and with switching on of the operating switch 6B, an operation output for the machinery is generated from the operation control circuit 6.

In the case where an emergency situation arises and the push button 16 of the emergency stop switch 10 is pushed, the second core member 15 is moved downwards in FIG. 2 (A) against the resilient urging force of the spring 17, thus separating from the first core member 14 and opening the closed magnetic circuit. As a result, the output level on the secondary winding 13 side drops considerably or becomes zero, so that the output from the self hold circuit 6A is stopped and the machinery is emergency stopped.

With the emergency stop switch 10 of such a construction, since electrical contact points such as with the conventional emergency stop switch are not used, there is absolutely no possibility of a fusion fault of the contact points, and hence the danger of where the emergency stop switch does not operate due to a fusion fault of the contact points at the time of an emergency stop of the machinery can be avoided. Consequently the reliability of the emergency stop switch can be improved, and operator safety ensured.

Figure 4:
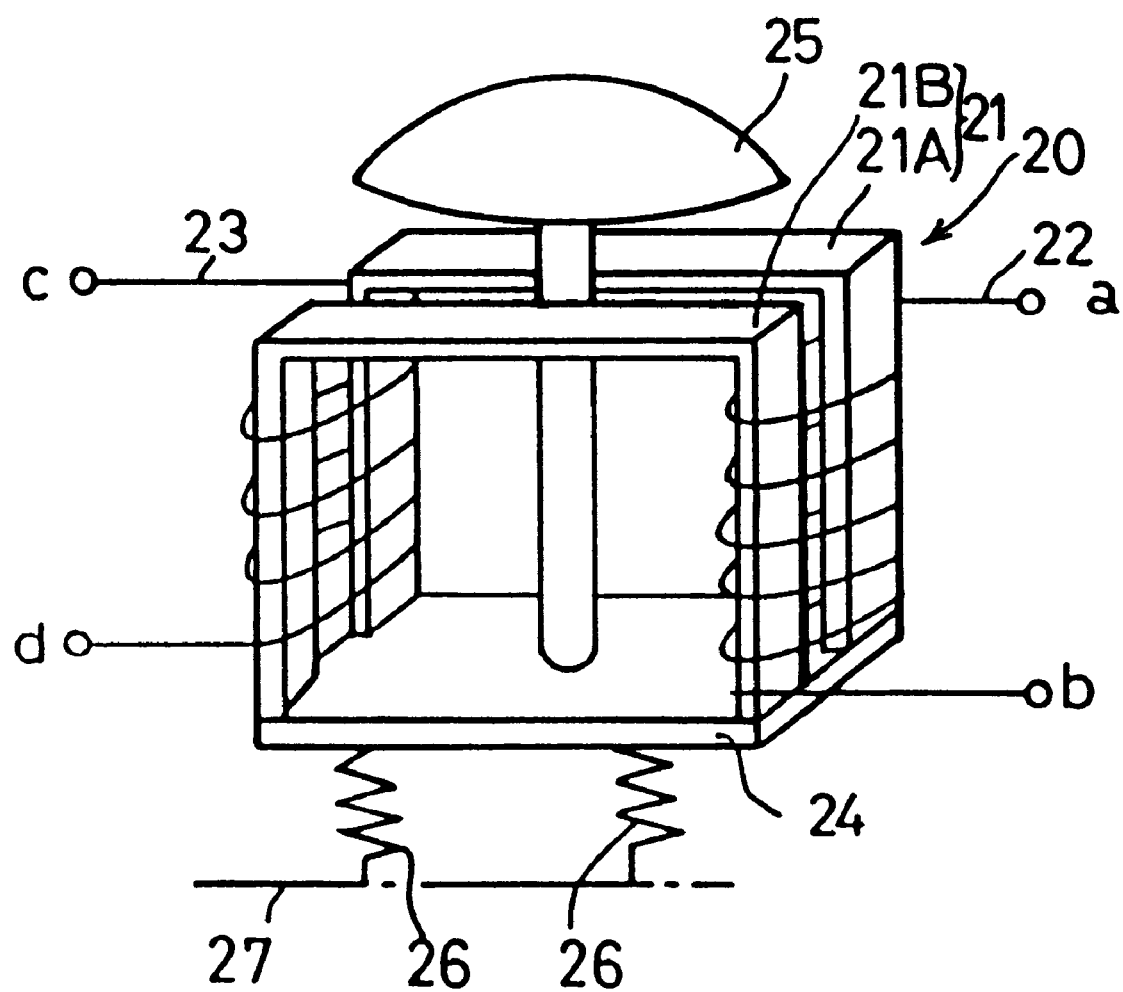
FIG. 4 is a schematic diagram showing a second embodiment of an emergency stop switch according to the present invention.

Next, FIG. 4 shows a second embodiment of an emergency stop switch.

With an emergency stop switch 20 of FIG. 4, a first core member 21 is made up of two C-shaped members 21A, 21B. The two C-shaped members 21A, 21B are secured inside a case 27 with a gap of a predetermined width therebetween, and a primary winding 22 and a secondary winding 23 are wound so as to span across the two C-shaped members 21A, 21B. A second core member 24 is formed for example as a rectangular plate member. A push button 25 is inserted in the gap between the C-shaped members 21A, 21B, with an end portion secured to the second core member 24. A plurality of springs 26 are provided between a bottom portion of the second core member 24 and a wall face of the case 27 for resiliently urging the second core member 24 in the upward direction in FIG. 4.

The operation of the emergency stop switch 20 is the same as for the first embodiment, and at normal times the second core member 24 is contacted with the two C-shaped members 21A, 21B of the first core member 21 by the springs 26 to thus form a transformer. Therefore an AC current supplied to the primary winding 22 side is transmitted to the secondary winding 23 side. If the push button 25 is pushed, the second core member 24 separates from the first core member 21 so that the transformer is no longer formed, and the AC current supplied to the primary winding 22 side is no longer transmitted to the secondary winding 23 side. Therefore the emergency stop line input for the operation control circuit 6 is stopped, thus stopping the operation output so that the machinery is emergency stopped.

Figure 5:
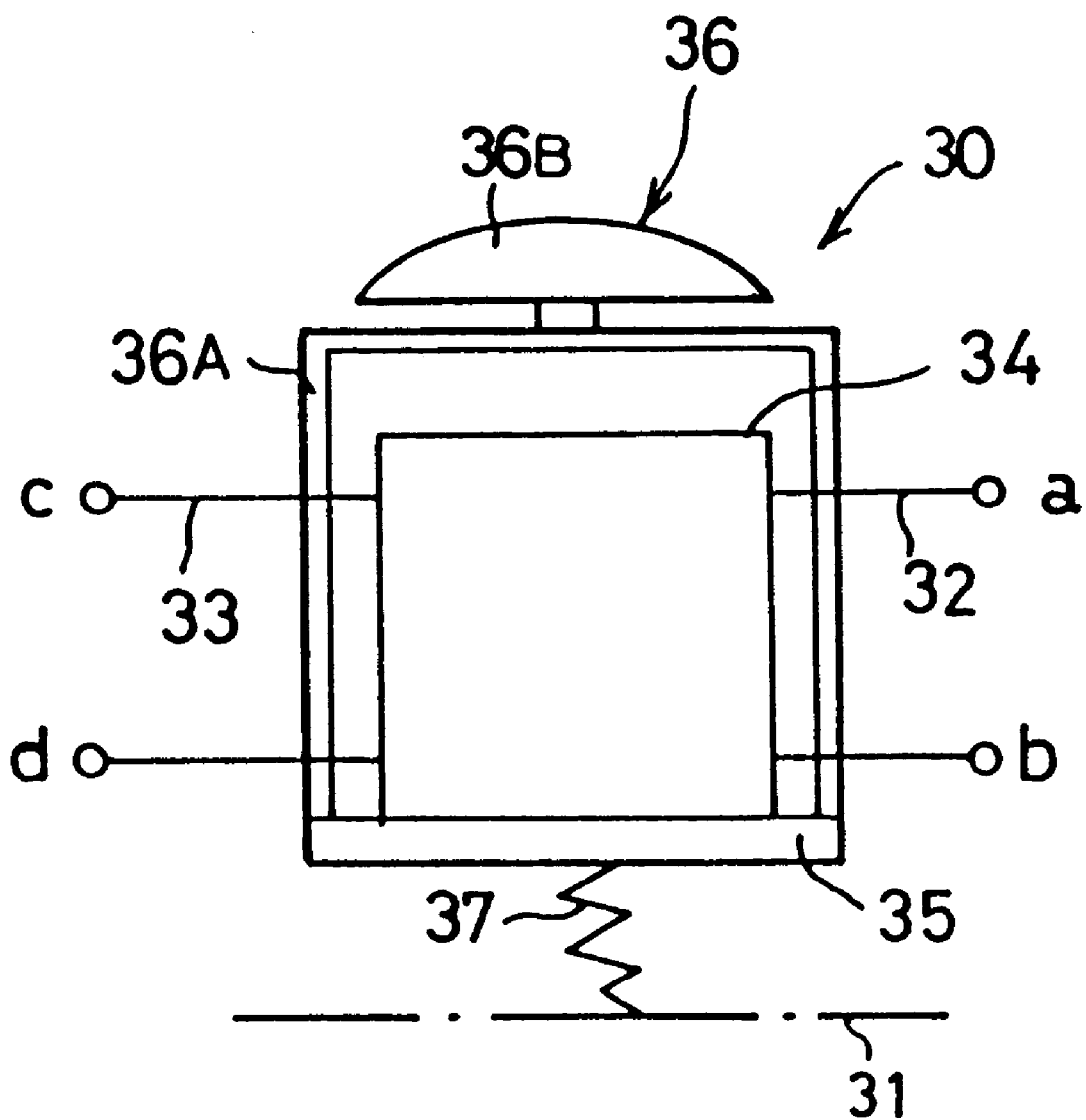
FIG. 5 is a schematic diagram showing a third embodiment of an emergency stop switch according to the present invention.

Next, FIG. 5 shows a third embodiment of an emergency stop switch.

A first core member 34 of an emergency stop switch 30 of FIG. 5 has the same shape as for the first embodiment, except that the internal cylindrical column has no through hole. Furthermore, a second core member 35 is a larger diameter disc than in the first embodiment. A push button 36 is formed with a C-shaped member 36A provided outside of the first core member 34, with both end portions secured to outer peripheral portions of the second core member 35, and a button shaped push portion 36B secured to an upper end central portion of the C-shaped member 36A. In FIG. 5 numeral 31 denotes a case, numerals 32 and 33 respectively denote a primary winding and a secondary winding which are wound around the cylindrical column inside the first core member 34 and are taken out therefrom, and numeral 37 denotes a spring.

The operation of the emergency stop switch 30 of such a construction is also the same as for the first and second embodiments, and at normal times the second core member 35 is contacted with the first core member 34 under the resilient urging force of the spring 37 to thus form a transformer. Therefore an AC current supplied to the primary winding 32 side is transmitted to the secondary winding 33 side. If the push portion 36B of the push button 36 is pushed, then by means of the C-shaped member 36A, the second core member 35 is separated from the first core member 34 so that the transformer is no longer formed, and the AC current supplied to the primary winding 32 side is no longer transmitted to the secondary winding 33 side. Therefore the emergency stop line input for the operation control circuit 6 is stopped, thus stopping the operation output so that the machinery is emergency stopped.

Next is a description of an emergency stop switch circuit according to the present invention, made up of a plurality of the abovementioned transformer structured non contact point emergency stop switches connected in series.

Figure 6:
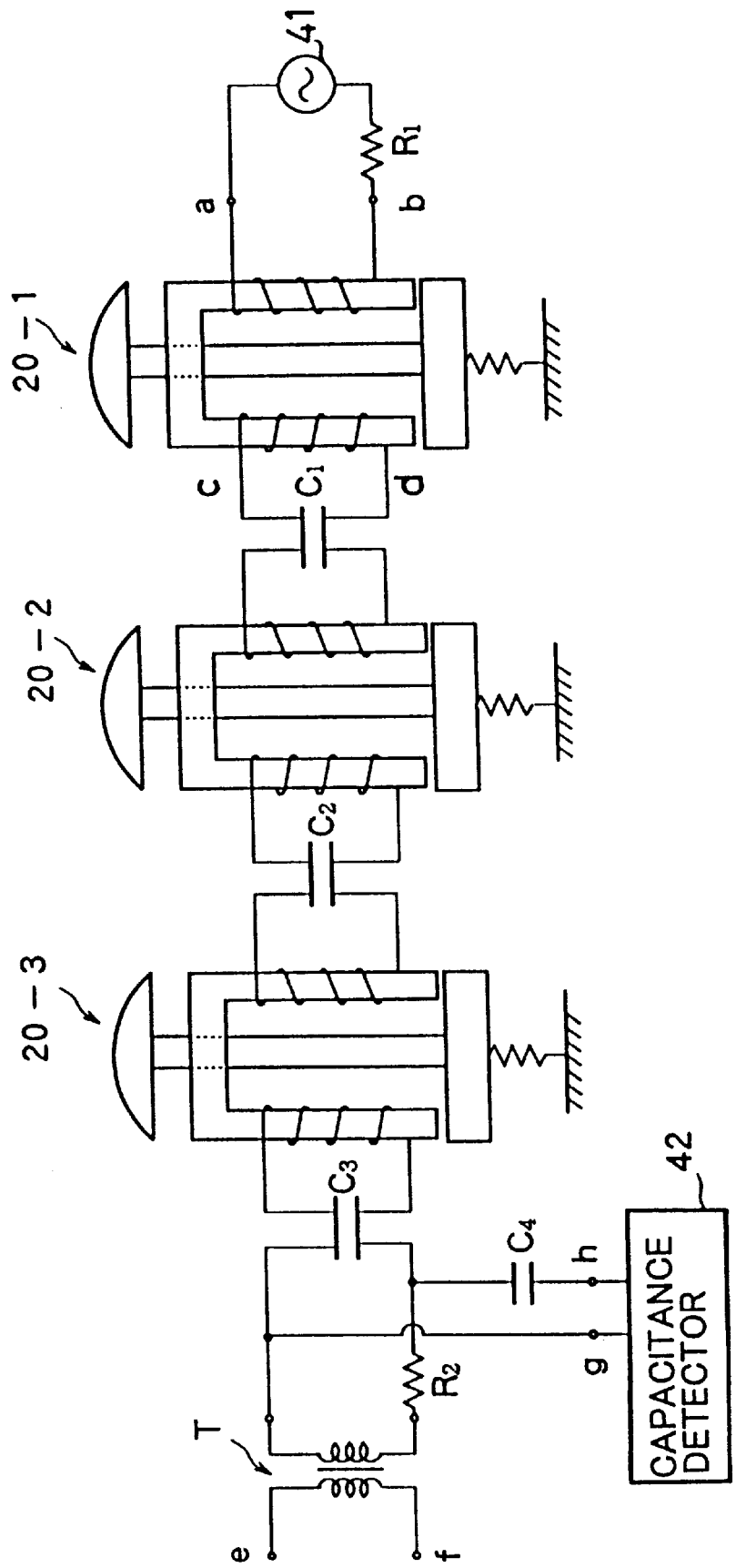
FIG. 6 is a circuit diagram showing a first embodiment of an emergency stop switch circuit according to the present invention.

FIG. 6 shows a circuit diagram of a first embodiment of an emergency stop switch circuit being a circuit where three emergency stop switches 20 constructed as in FIG. 4 are connected in series.

In FIG. 6, an oscillator 41 serving as an AC signal generating source is connected to primary winding terminals a, b of a first stage emergency stop switch 20-1 via a resistor $R_1$. A secondary winding of the first stage emergency stop switch 20-1 and a primary winding of a next stage emergency stop switch 20-2, and a secondary winding of the next stage emergency stop switch 20-2 and a primary winding of a last stage emergency stop switch 20-3 are respectively connected in series. Four terminal capacitors $C_1$ and $C_2$ are connected in parallel to the respective connection portions. A secondary winding of the last stage emergency stop switch 20-3 is connected in series to a primary side of a transformer T via a resistor R2, with a four terminal capacitor C3 connected in parallel therewith. Terminals e, f of a secondary side of the transformer T are connected to the operation control circuit 6 as in FIG. 3. In this case, an amplifier may be provided in the operation control circuit 6 to amplify signals input via the terminals e, f of the emergency stop switch. Moreover, a capacitance detector 42 serving as a capacitance detection device for detecting the capacitance of the series circuit of the emergency stop switches is connected in parallel to the primary side of the transformer T via a capacitor $C_4$. The capacitance detector 42 has the function of making known the work site where the emergency stop switch is pushed, and is provided for example in the monitor 5 of FIG. 1.

Figure 7:
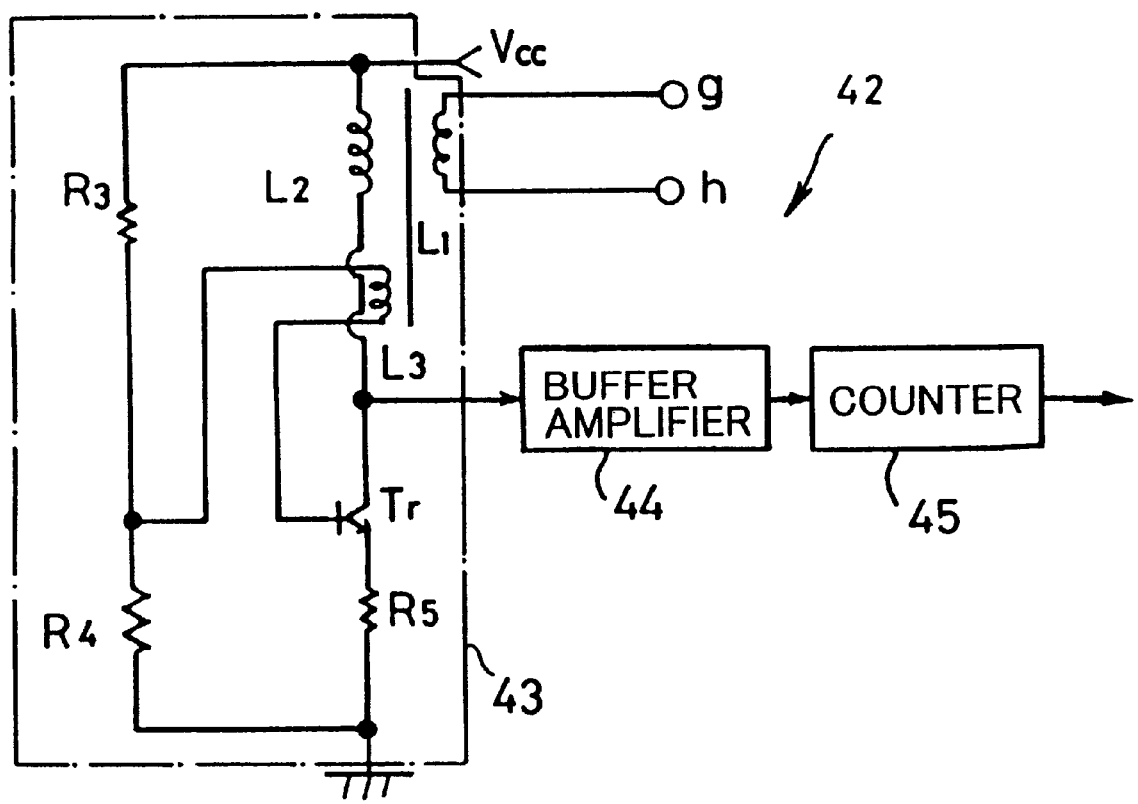
FIG. 7 is a circuit diagram of the capacitance detector shown in FIG. 6.

With the capacitance detector 42, as shown by the example in FIG. 7, an oscillation output from an oscillator 43 comprising resistors $R_3$~$R_5$, a transistor Tr, and coils $L_1$~$L_3$, is input via a buffer amplifier 44 to a counter 45, and a change in capacitance is detected from a change in frequency of the oscillator output. At normal times, there is no output from the counter 45. In the case where one of the emergency stop switches 20-1~20-3 is operated, an output signal corresponding to the frequency of the oscillation output at that time is output, thereby notifying of the location of the operated emergency stop switch. It will be obvious that a known impedance bridge could also be used for detecting capacitance.

Next is a description of the operation of the emergency stop switch circuit of FIG. 6.

At normal times, all of the emergency stop switches 20-1~20-3 function as transformers, and hence the AC signal from the oscillator 41 is transmitted to the transformer T via the three emergency stop switches 20-1~20-3, and is then transmitted to the operation control circuit 6 via the secondary side terminals e, f of the transformer T. As a result, in the operation control circuit 6, a signal is input for example to the reset input terminal of the self hold circuit 6A so that with the switching on of the operating switch 6B, an operation output is produced. By having the relationship between the resistance value $r_1$ of the resistor $R_1$ and the resistance value $r_2$ of the resistor $R_2$ as $r_2 \gg r_1$, then the resistor $R_1$ becomes the load of the oscillator 43 in the capacitance detector 42 and when an emergency stop switch is not pushed, the oscillator 43 does not oscillate and there is no output from the counter 45. Hence there is no notification of the occurrence of an emergency situation. If the oscillating frequency of the oscillator 41 is made f1 and the oscillating frequency of the oscillator 43 in the capacitance detector 42 is made f2, then if $f2 \gg f1$, the electrostatic capacity of the four terminal capacitors C1~C3 can be reduced, and hence the four terminal capacitors C1~C3 do not influence the transmission of the output signal from the oscillator 41.

In the case where one of the push buttons of the three emergency stop switches 20-1~20-3 is pushed, the transformer function of the pushed emergency stop switch is lost and hence the output signal from the oscillator 41 is not transmitted to the transformer T. Therefore, the input to the operation control circuit 6 is stopped thus stopping the operation output and stopping operation of the machinery.

Furthermore, in the case where for example the emergency stop switch 20-1 is operated, then the three capacitors C1~C3 are connected in parallel to the coil $L_1$ of the capacitance detector 42. In the case where the emergency stop switch 20-2 is operated, the capacitor C1 is cut off, so that only the two capacitors C2, C3 are connected in parallel to the coil $L_1$ of the capacitance detector 42. In the case where the emergency stop switch 20-3 is operated the capacitors C1 and C2 are cut off, so that only the capacitor C3 is connected to the coil $L_1$ of the capacitance detector 42. With a reduction in the number of connected capacitors, the capacitance value of the load on the oscillator 43 is reduced so that the oscillation frequency of the oscillator 43 increases. In this way, the oscillation frequency of the oscillator 43 of the capacitance detector 42 changes in accordance with the location of the pushed emergency stop switch, and this change in oscillation frequency can be detected from the count value of the counter 45. Consequently, the location of the pushed emergency stop switch can be known from the count value of the counter 45, and hence the work site where the emergency situation has occurred can be known by the monitor 5.

With an emergency stop switch circuit of such a construction, then even if the emergency stop switches 20-1~20-3 side and the operation control circuit 6 or the monitor 5 side are installed at locations away from each other, the amount of wiring can be just that for connecting the transformer T to the operation control circuit 6. Moreover, even in the case where the position of the operated emergency stop switch is monitored, there is only the addition of the wiring for connecting the secondary side of the last stage emergency stop switch to the capacitance detector 42. Consequently, the wiring can be considerably reduced compared to heretofore (the device where the output line of one emergency stop switch is connected to the relay terminal plate by a single cable common to four lines) Moreover, since the emergency stop switches 20-1~20-3 have no electrical contact points, there is no possibility of a fusion fault, and hence the reliability of the switch circuit is also improved. Furthermore, using a four terminal capacitor has the advantage that if a disconnection fault occurs in the capacitor terminals between the emergency stop switches 20-1~20-3, the output from the terminals e, f is lost, so that the emergency stop line input to the operation control circuit 6 is stopped and the operation output stops.

Figure 8:
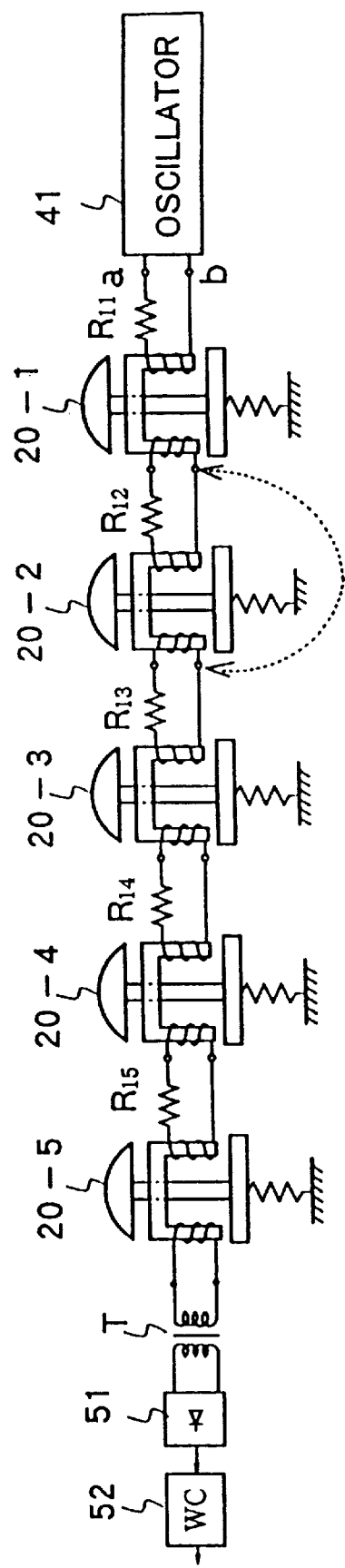
FIG. 8 is a circuit diagram showing a second embodiment of an emergency stop switch circuit according to the present invention.

FIG. 8 shows a second embodiment of an emergency stop switch circuit.

This embodiment is an example of a construction provided with a function for detecting a short circuit fault in the case where any one of the plurality of series connected emergency stop switches is short circuited. Here parts the same as in the first embodiment of FIG. 6 are denoted by the same symbols and description is omitted.

In FIG. 8, the embodiment is an example for where five emergency stop switches of the same construction as in FIG. 6 are connected in series. Resistors $R_{11}$~$R_{15}$ are respectively connected in series to the respective primary winding sides of the respective emergency stop switches 20-1~20-5, to thereby connect the emergency stop switches 20-1~20-5 in series. An oscillator 41 is connected to terminals a, b of the primary winding of the first stage emergency stop switch 20-1 to supply an AC signal thereto. A primary winding side of a transformer T is connected to the secondary winding side of the last stage emergency stop switch 20-5. A window comparator 52 serving as a level detection device is connected to the secondary winding side of the transformer T via a rectifying circuit 51 (corresponding to the rectifying circuit 18 of FIG. 3). An output signal from the window comparator 52 is supplied to the operation control circuit 6 via a rectifying circuit (not shown in the figure). Consequently, the window comparator 52 is inserted in the location indicated by the broken line in FIG. 3.

The window comparator 52 is a heretofore known device such as disclosed for example in PCT/JP93/00411 or WO94/23303, made up of a plurality of transistors and resistors, and oscillates when an input signal within a predetermined threshold value range of a higher level than the power source potential is input to the input terminal, and thus generates an AC output. Furthermore, the construction is fail-safe in that at the time of a fault an output is not produced.

Next is a description of the operation of the emergency stop switch circuit of FIG. 8.

At normal times, the AC signal from the oscillator 41 is transmitted to the transformer T via the respective emergency stop switches 20-1~20-5. In this case, an input signal of a level within the predetermined threshold value range is input to the window comparator 52 via the rectifying circuit 51. As a result, an output signal is produced from the window comparator 52 and rectified, and supplied to the operation control circuit 6, so that a reset input signal is applied to the self hold circuit 6A, thus enabling an operation output to be produced.

On the other hand, in the case where for example with the emergency stop switch 20-2, a short circuit fault occurs between the primary winding terminal and the secondary winding terminal as shown by the dotted line in FIG. 8, the resistor $R_{12}$ is removed from the switch circuit so that the load component due to the resistor $R_{12}$ is lost. Therefore, the input signal level to the window comparator 52 rises and exceeds the upper limit threshold value of the window comparator 52 so that the output from the window comparator 52 stops and the input signal to the operation control circuit 6 is cancelled.

With such a construction, if only one of the emergency stop switches 20-1~20-5 short-circuits, the operation output to the machinery is stopped so that operation is no longer possible, and hence the fact that an emergency stop switch has short-circuited can be known. Consequently, the dangerous situation where any person intentionally makes an emergency stop switch to be short-circuited so that the emergency stop switch function is lost can be prevented.

Figure 9:
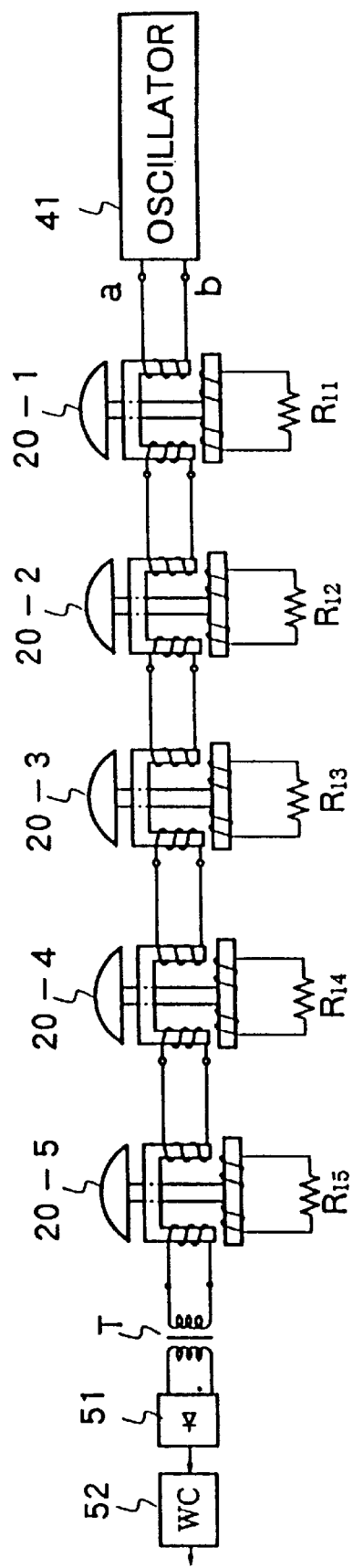
FIG. 9 is a circuit diagram showing a third embodiment of an emergency stop switch circuit according to the present invention.

Here, as shown in FIG. 9, tertiary windings may be provided on the second core members of the respective emergency stop switches 20-1~20-5, and resistors $R_{11}$~$R_{15}$ connected in series to these tertiary windings. In the case of this embodiment also, there is an operational effect the same as for embodiment of FIG. 8. Moreover, if in particular with the window comparator the resistance measurement is not made, a resonance circuit may be constructed when the respective emergency stop switches 20-1~20-5 make up a closed magnetic circuit with the resistors $R_{11}$~$R_{15}$ of FIG. 9 as capacitors.

With the abovementioned respective embodiments, the emergency stop switch has been a push button type, however it is not necessary to be limited to a push button construction.

Figure 10:
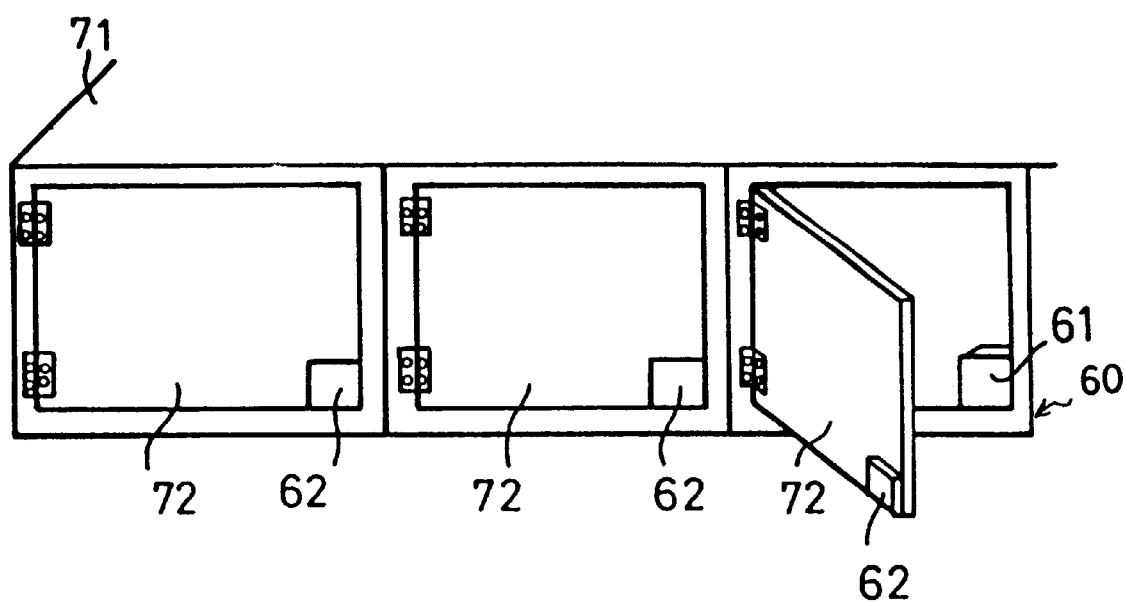
FIG. 10. is a schematic diagram showing an embodiment of a door switch type emergency stop switch.

For example, this may be a door switch type as shown in FIG. 10.

In FIG. 10, an emergency stop switch 60 comprises first core members 61 wound with a primary winding and a secondary winding, attached to a fixed safety fence 71 side which houses the operating machinery, and second core members 62 which make up transformers with the first core members 61 respectively attached to the front face or rear face of respective doors 72 which constitute moving devices for the safety fence 71.

With such a construction, if a door 72 is closed then the second core member 62 approaches the first core member 61 to thus form a transformer. Hence an input signal is supplied to the operation control circuit 6 side from the emergency stop switch 60, thus enabling an operation output for the machinery inside the safety fence 71 to be generated. On the other hand, with a door 72 in an open condition, the second core member 62 is separated from the first core member 61 and hence the transformer is not formed and the operation output for the machinery stops.

With such a construction, in the case where an operator opens a door 72 and approaches the machinery inside the safety fence 71, the operation output for the machinery is positively stopped and hence operator safety can be ensured.

Figure 11:
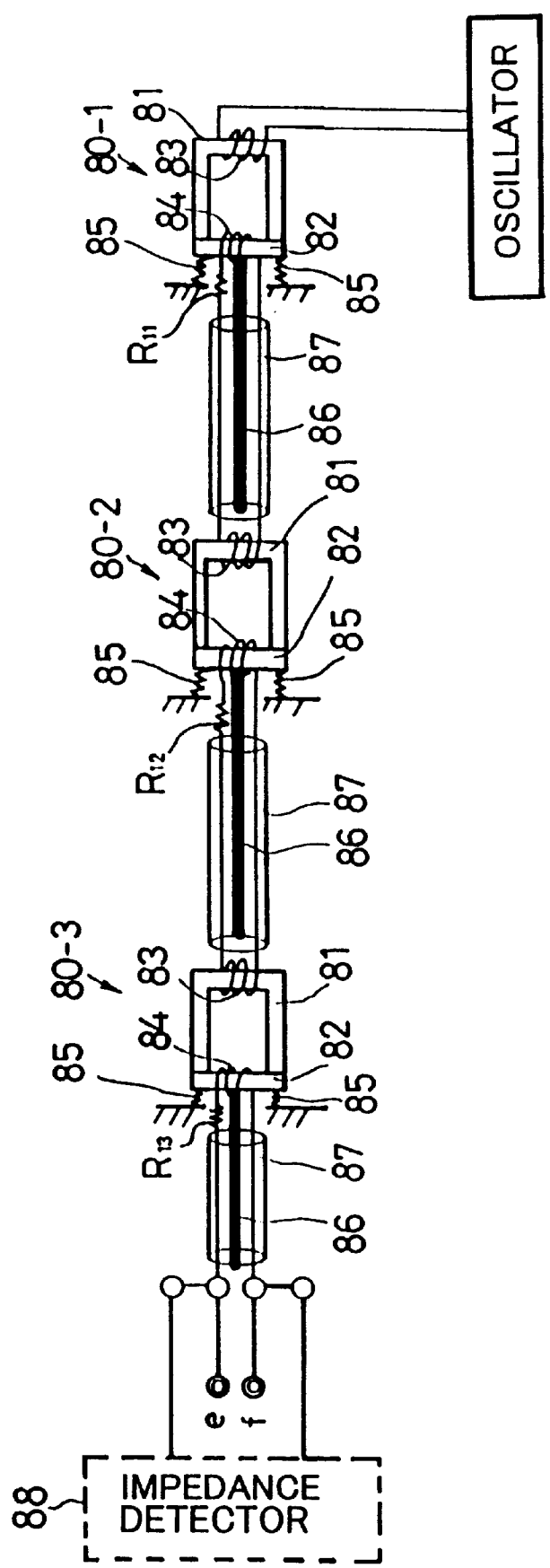
FIG. 11 is a circuit diagram showing an embodiment of an emergency stop switch circuit which uses a rope switch type emergency stop switch.

An emergency stop switch where a rope is used instead of the push button is also possible. FIG. 11 shows an emergency stop switch circuit example for where rope switch type emergency stop switches are severally connected.

In FIG. 11, each of emergency stop switches 80-1~80-3 which use ropes, incorporates a first core member 81 of approximate C-shape wound with a primary winding 83, a second core member 82 wound with a secondary winding 84, a spring 85 for resiliently urging the second core member 82 in a direction to approach the first core member 81, and a rope 86 for moving the second core member 82 against the resilient urging force of the spring 85 in a direction to separate from the first core member 81. The secondary winding 84 of the first stage emergency stop switch 80-1 is connected to the primary winding 83 of the next stage emergency stop switch 80-2 via a resistor $R_{11}$, the secondary winding 84 of the emergency stop switch 80-2 is connected to the primary winding 83 of the last stage emergency stop switch 80-3 via a resistor $R_{12}$, and the last stage emergency stop switch 80-3 has the secondary winding 84 thereof connected to output terminals e, f via a resistor $R_{13}$. The output terminals e, f are connected to the operation control circuit 6 of FIG. 1, and are connected in parallel to an impedance detector 88 for detecting the impedance of the emergency stop switch circuit. The impedance detector 88 may be provided in the monitor 5. The respective ropes 86 are covered together with electrical wires which are electrically connected between the switches by a covering member 87 such as a pipe or tube (for example made of rubber). Here the moving device comprises the spring 85 and the rope 86.

Next is a description of the operation of the emergency stop switch circuit of FIG. 11.

With the respective emergency stop switches 80-1~80-3, if the respective ropes 86 are pulled, the second core member 82 is separated from the first core member 81 so that the magnetic path is opened. Therefore, a signal is not input to the operation control circuit 6 from the output terminals e, f and hence operation of the machinery is stopped. At this time, which emergency stop switch has been operated can be known from the monitor 5 based on the impedance value detected by the impedance detector 88.

With the emergency stop switch circuit of such construction, if the rope 86 is cut, the covering member 87 is cut, and at this time the electrical wire is also cut. Hence there is the characteristic that the operation of the machinery can always be stopped at the time of a disconnection fault in the rope 86.

Next is a description of a structural example of an emergency stop switch circuit which can directly monitor for faults in respective emergency stop switches at individual work sites where the emergency stop switches are installed.

Figure 12:
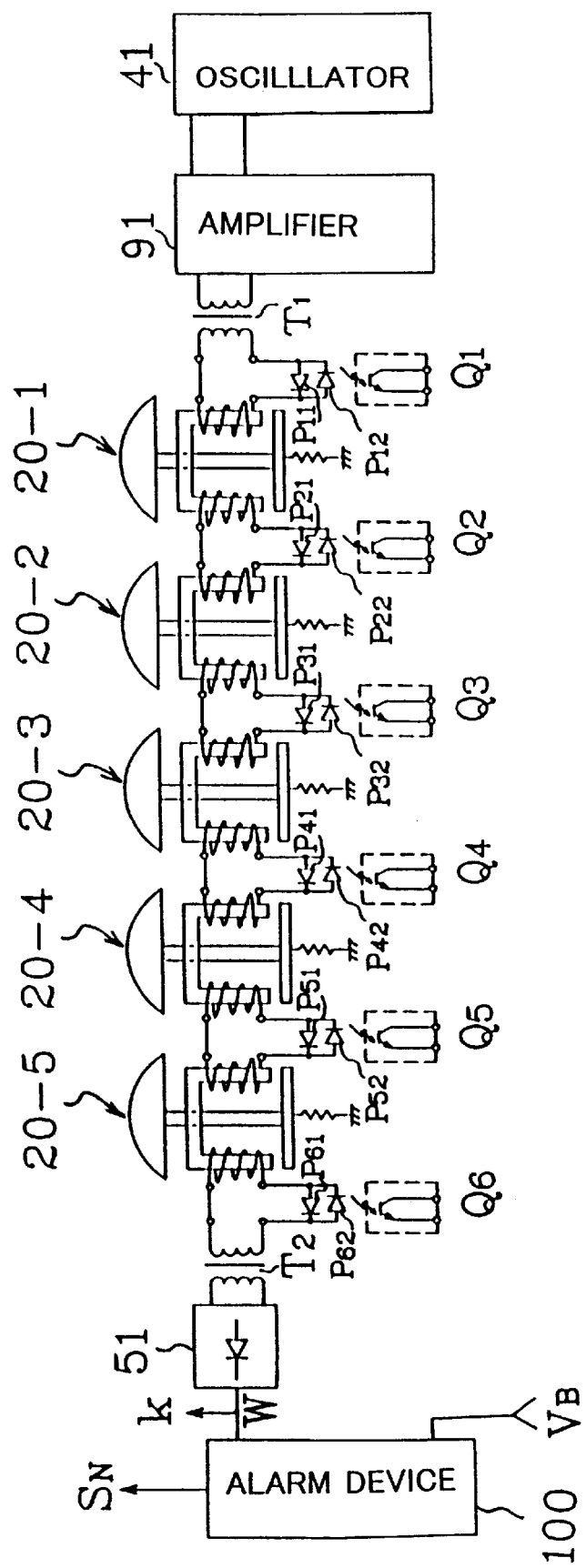
FIG. 12 is a circuit diagram showing an embodiment of an emergency stop switch circuit incorporating light emitting elements.

FIG. 12 shows an embodiment applied to an emergency stop switch circuit with five emergency stop switches of FIG. 4 connected in series as in FIG. 8. Here, parts the same as in FIG. 8 are denoted by the same symbols and description is omitted.

In FIG. 12, the five emergency stop switches 20-1~20-5 as in FIG. 8 have the secondary winding of the first stage emergency stop switch 20-1 and the primary winding of the next stage emergency stop switch 20-2, the secondary winding of the emergency stop switch 20-2 and the primary winding of the next stage emergency stop switch 20-3, the secondary winding of the emergency stop switch 20-3 and the primary winding of the next stage emergency stop switch 20-4, and the secondary winding of the emergency stop switch 20-4 and the primary winding of the last stage emergency stop switch 20-5 connected in series to thus make up a signal transmission system by means of transformer coupling. Furthermore, the AC signal generated from the oscillator 41 is supplied to the terminals of the primary winding of the first stage emergency stop switch 20-1 via an amplifier 91 and a transformer T1. The output signal (shown as signal K in FIG. 12) generated from the secondary winding of the last stage emergency stop switch 20-5 is input to the operation control circuit 6 via a transformer T2 (corresponding to transformer T in FIG. 8) and a rectifying circuit 51. Furthermore, with the present embodiment, an alarm device 100 is provided in parallel with the operation control circuit 6, and takes the output signal from the rectifying circuit 51 (shown as signal W in FIG. 12). The alarm device 100 has a function for monitoring for faults in itself as described later.

Figure 13:
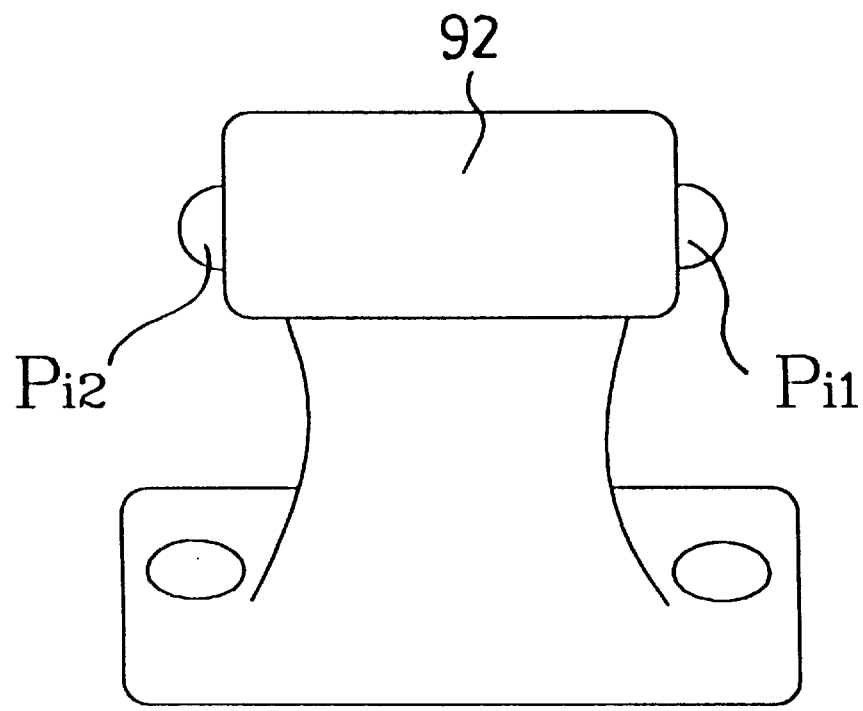
FIG. 13 is a diagram showing a specific example of an attachment condition for the light emitting elements of FIG. 12.

Furthermore, with the present embodiment, instead of the resistors $R_{11}$~$R_{15}$ of FIG. 8, light emitting elements $P_{11}$, $P_{12}$, $P_{21}$, $P_{22}$, $P_{31}$, $P_{32}$, $P_{41}$, $P_{42}$, $P_{51}$, $P_{52}$ are provided as pairs in parallel with each other such that respective forward directions are opposite to each other, on the primary winding sides of the respective emergency stop switches 20-1~20-5. Moreover, a similarly arranged parallel pair of light emitting elements $P_{61}$, $P_{62}$ are connected in series between the secondary winding of the last stage emergency stop switch 20-5 and the transformer T2. These light emitting elements $P_{i1}$, $P_{i2}$ (i=1~6) are provided in a case 92 such as shown in FIG. 13, and are installed for example close to the emergency stop switches at the respective work sites where the emergency stop switches 20-1~20-5 are provided. Here with this embodiment, the window comparator 52 of FIG. 8 is not necessary.

Figure 14:
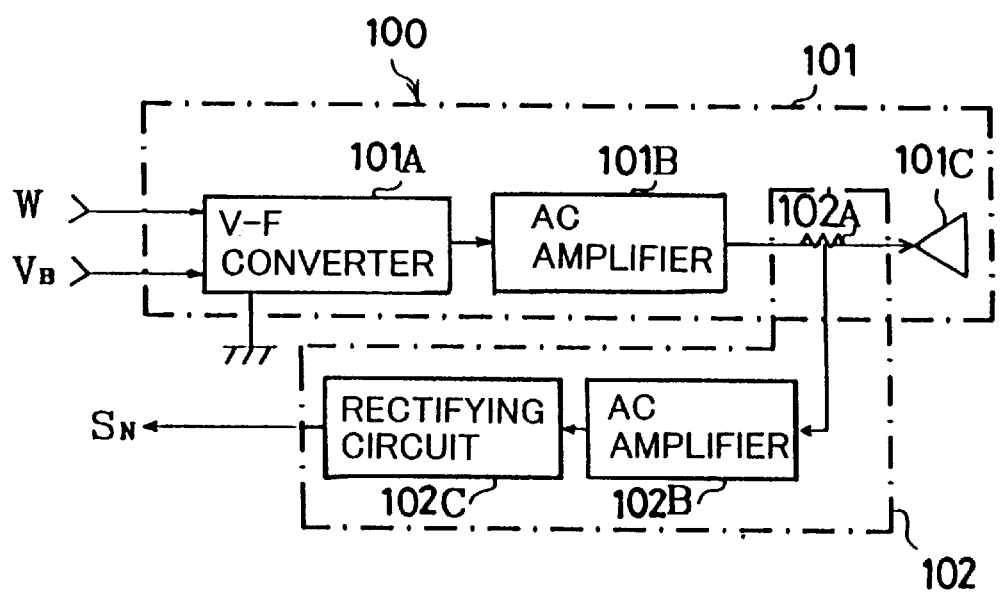
FIG. 14 is a circuit diagram of the alarm device of FIG. 12.

Next FIG. 14 shows a construction of the alarm device 100.

In FIG. 14, the alarm device 100 comprises; a warning sound generating circuit 101 for generating, based on the voltage level of the output signal W from the rectifying circuit 51, a warning sound of an audible frequency range when there is no output signal W (low level), and generating a warning sound of an inaudible frequency range when there is an output signal W (high level), and a monitoring circuit 102 for monitoring for a fault in the alarm device 100 based on the presence of the two warning sounds from the warning sound generating circuit 101.

The warning sound generating circuit 101 comprises; a voltage-frequency convertor (referred to hereunder as a V-F convertor) 101A into which is input the output signal W from the rectifying circuit 51 and a bias voltage $V_B$ lower than the voltage level of the output signal W, for generating a frequency signal corresponding to the input voltage level, an AC amplifier 101B for amplifying the output from the V-F convertor 101A, and a speaker 101 C which is driven by the output from the AC amplifier 101B. The V-F convertor 101A generates a signal of an inaudible frequency (for example 20 KHz) when the input voltage is high (when W+$V_B$) and generates a signal of an audible frequency (for example several KHz) when the input voltage is low (when $V_B$ only).

The monitoring circuit 102 comprises; a current transformer 102A for detecting the output current from the AC amplifier 101B to be input to the speaker 101C, an AC amplifier 102B for amplifying the output from the current transformer 102A, and a rectifying circuit 102C for rectifying the output from the AC amplifier 102B.

The operation of the alarm device of such construction will now be briefly described.

In the case where the output signal W is not input, the input voltage level of the V-F convertor 101A becomes the bias voltage $V_B$ only, and an audible frequency signal is generated from the V-F convertor 101A. This output signal is amplified by the AC amplifier 101B to drive the speaker 101C so that a warning sound of audible frequency is generated from the speaker 101C. On the other hand, when the output signal W is input, the input voltage level of the V-F convertor 101A becomes the sum of the bias voltage $V_B$ and the voltage level of the output signal W, becoming an input of a high voltage level. This high level input signal may be produced by a known method such as rectifying the AC output signal W using a voltage doubler rectifying circuit and superimposing this on the bias voltage $V_B$. In this way, an inaudible frequency signal is generated from the V-F convertor 101A and this output signal is amplified by the AC amplifier 101B to drive the speaker 101C. In this case, if the alarm device 100 is normal, a warning sound of an inaudible frequency is generated from the speaker 101C and hence there is no disturbing noise which can be heard by personnel.

When a signal of either an audible frequency or an inaudible frequency is input to the speaker 101C, this input signal is received by the current transformer 102A. The received signal is amplified by the AC amplifier 102B, rectified by the rectifying circuit 102C, and a DC output signal $S_N$ is generated from the monitoring circuit 102. On the other hand, if for example a fault occurs in any one of; the V-F convertor 101A, the AC amplifiers 101B, 102B, the current transformer 102A, or the rectifying circuit 102C, or a disconnection fault occurs in the coil or lead wire of the speaker 101C, then the DC output signal $S_N$ is not produced. Consequently, if the presence of the output signal $S_N$ is monitored, for example by a monitor 5 installed in a remote centralized monitoring room, then monitoring for faults in the respective alarm devices 100 can be centrally monitored at one location.

Figure 15:
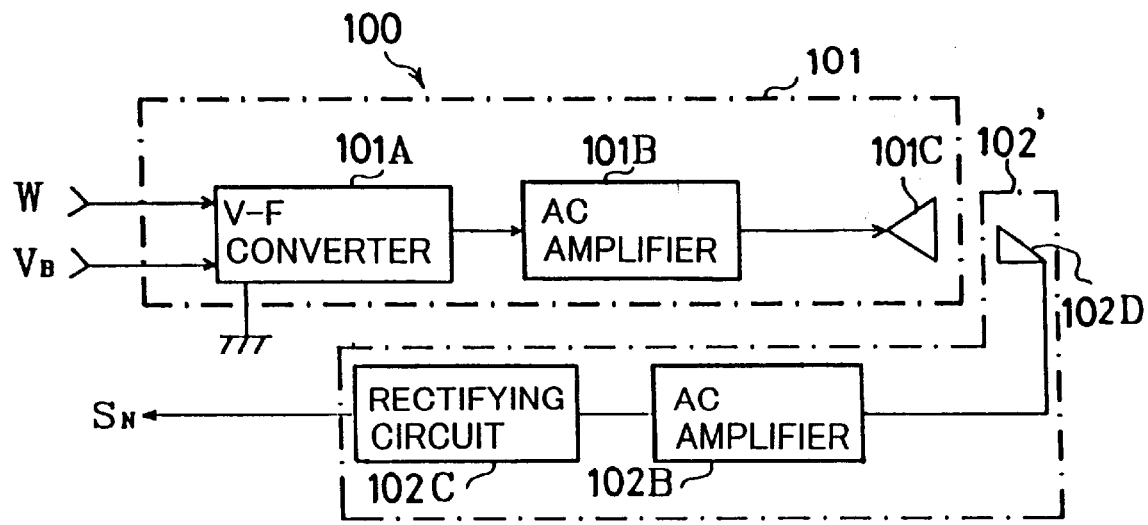
FIG. 15 is another circuit diagram of an alarm device.

Furthermore, as shown in FIG. 15, instead of the current transformer 102A, a monitoring circuit 102' using a microphone is possible. That is to say, a microphone 102D is provided near the speaker 101C and the warning sound of an audible frequency or inaudible frequency generated from the speaker 101C is received by the microphone 102D and converted to an electrical signal and then sent to the AC amplifier 102B. In this case also, if the warning sound generating circuit 101 and the monitoring circuit 102' are normal, an output signal $S_N$ is generated from the monitoring circuit 102' by the received signal output from the microphone 102D, while in the case where a fault occurs in the alarm device 100, the output signal $S_N$ is not generated, and hence an abnormality in the alarm device 100 can be known.

Figure 16:
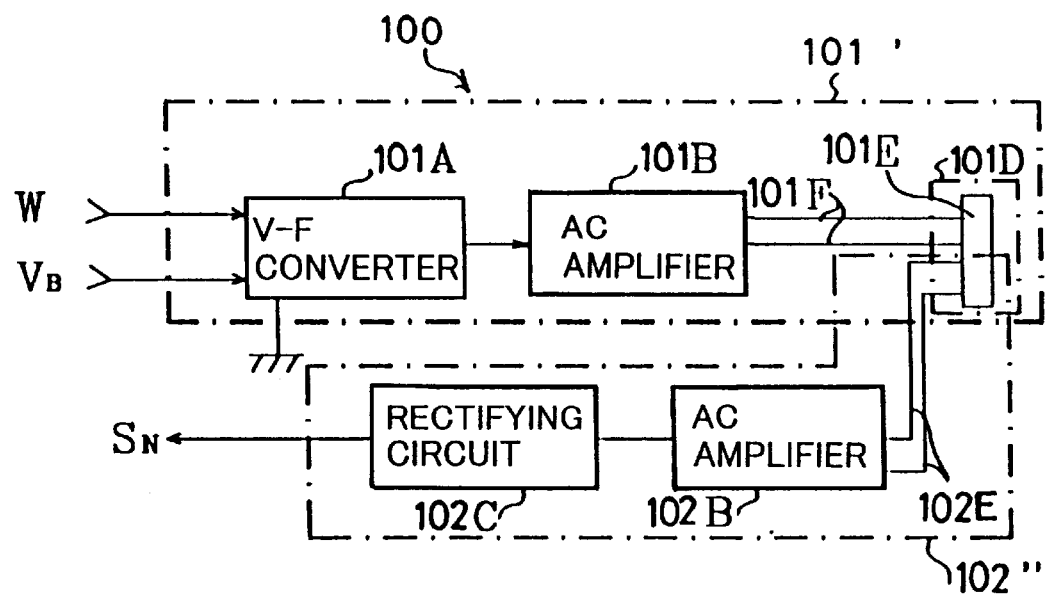
FIG. 16 is yet another circuit diagram of an alarm device.

Moreover, as shown in FIG. 16, instead of the warning sound generating circuit 101C, a warning sound generating circuit 101' which uses a piezoelectric buzzer 101D utilizing a piezoelectric element is possible. That is to say, the output signal from the AC amplifier 101B is supplied to a vibration body 101E of the piezoelectric buzzer 101D via lead wires 101F for excitation. Lead wires 102E for sending an electrical signal based on the vibration of the vibration body 101E to the AC amplifier 102B are connected to the vibration body 101E separate to the lead wires 101F. Here since the current for driving the vibration body 101E of the piezoelectric buzzer 101D is normally a small current, making it difficult to detect the current flowing in the lead wires 101F using a current transformer 102A as in FIG. 14, the vibration signal from the vibration body 101E is extracted by the lead wires 102E.

With such a construction, when the vibration body 101E is excited by the output signal from the AC amplifier 101B, an electrical signal is input to the AC amplifier 102B via the lead wires 102E and an output signal $S_N$ indicating that the alarm device 100 is normal is generated from a monitoring circuit 102".

Next is a description of the operation of the emergency stop switch circuit of FIG. 12.

The AC signal from the oscillator 41 is amplified by the amplifier 91 and then applied to the primary winding of the first stage emergency stop switch 20-1 via the transformer T1. When all of the emergency stop switches 20-1~20-5 are normal and are in the on condition, the AC signal generated by the oscillator 41 is transmitted to the transformer T2 via the series connected emergency stop switches 20-1~20-5. Therefore, all of the light emitting elements $P_{i1}$, $P_{i2}$ (i=1~6) come on (actually, the $P_{i1}$ (i=1~6) group and the $P_{i2}$ (i=1~6) group come on alternately for each half period of the AC signal) thus indicating that all of the emergency stop switches 20-1~20-5 are normal.

On the other hand, if for example a disconnection fault occurs in the secondary winding side of the emergency stop switch 20-3 or in the primary winding side of the emergency stop switch 20-4, then all of the light emitting elements $P_{41}$, $P_{42}$, $P_{51}$, $P_{52}$, $P_{61}$, $P_{62}$ are extinguished. Consequently, in this case it can be known that a fault has occurred in one of the emergency stop switches 20-3 and 204. Moreover, in the case where all of the light emitting elements $P_{i1}$, $P_{i2}$ (i=1~6) are extinguished, it can be known that a fault has occurred in one of; the oscillator 41, the amplifier 91, the transformer T1, or the primary winding side of the emergency stop switch 20-1. Furthermore, in the case where only the light emitting elements $P_{61}$ and $P_{62}$ are extinguished, it can be known that a fault has occurred in one of; the secondary winding of the emergency stop switch 20-5 or the primary winding of the transformer T2.

Furthermore, when any one of the emergency stop switches 20-1~20-5 are operated or a fault occurs therein, the output signal from the rectifying circuit 51 becomes a low level. As a result, a warning sound of an audible frequency range is generated from the alarm device 100 thus notifying of the occurrence of an emergency situation or a fault in the emergency stop switch circuit, and the machinery operation output from the operation control circuit 6 is lost, thus automatically stopping the machinery.

With such construction the occurrence of a fault in the emergency stop switches 20-1~20-5 can be immediately known by the extinguishing of the light emitting elements $P_{i1}$, $P_{i2}$ (i=1~6). Consequently, by installing the light emitting elements $P_{i1}$, $P_{i2}$ (1=1~6) at each work site, then danger to the operator due to the emergency stop switch not operating can be prevented beforehand. Moreover, in the case of this embodiment, since a warning sound of an audible frequency range is also generated from the alarm device 100 to thus notify that a fault has occurred, then fault notification to the operator can be even more reliably carried out. Furthermore, the construction is such that when the light emitting elements $P_{i1}$, $P_{i2}$ (1=1~6) are illuminated, this shows the safe condition where signal transmission is being normally carried out, while when the light emitting elements $P_{i1}$, $P_{i2}$ (1=1~6) are extinguished, this shows the danger condition where a fault exists in the signal transmission system. Consequently in the case for example where the light emitting elements $P_{i1}$, $P_{i2}$ (1=1~6) themselves have a disconnection fault and are extinguished, since this is shown as a danger condition, the construction is fail-safe. Moreover, it will be apparent that instead of using the light emitting elements $P_{i1}$, $P_{i2}$ (1=1~6) as shown in FIG. 13, these can be used as photocouplers Q1~Q6 as shown outlined by the dotted line in FIG. 12, and the output from the reception element side used for communication with a central side for managing the machinery operation.

Figure 17:
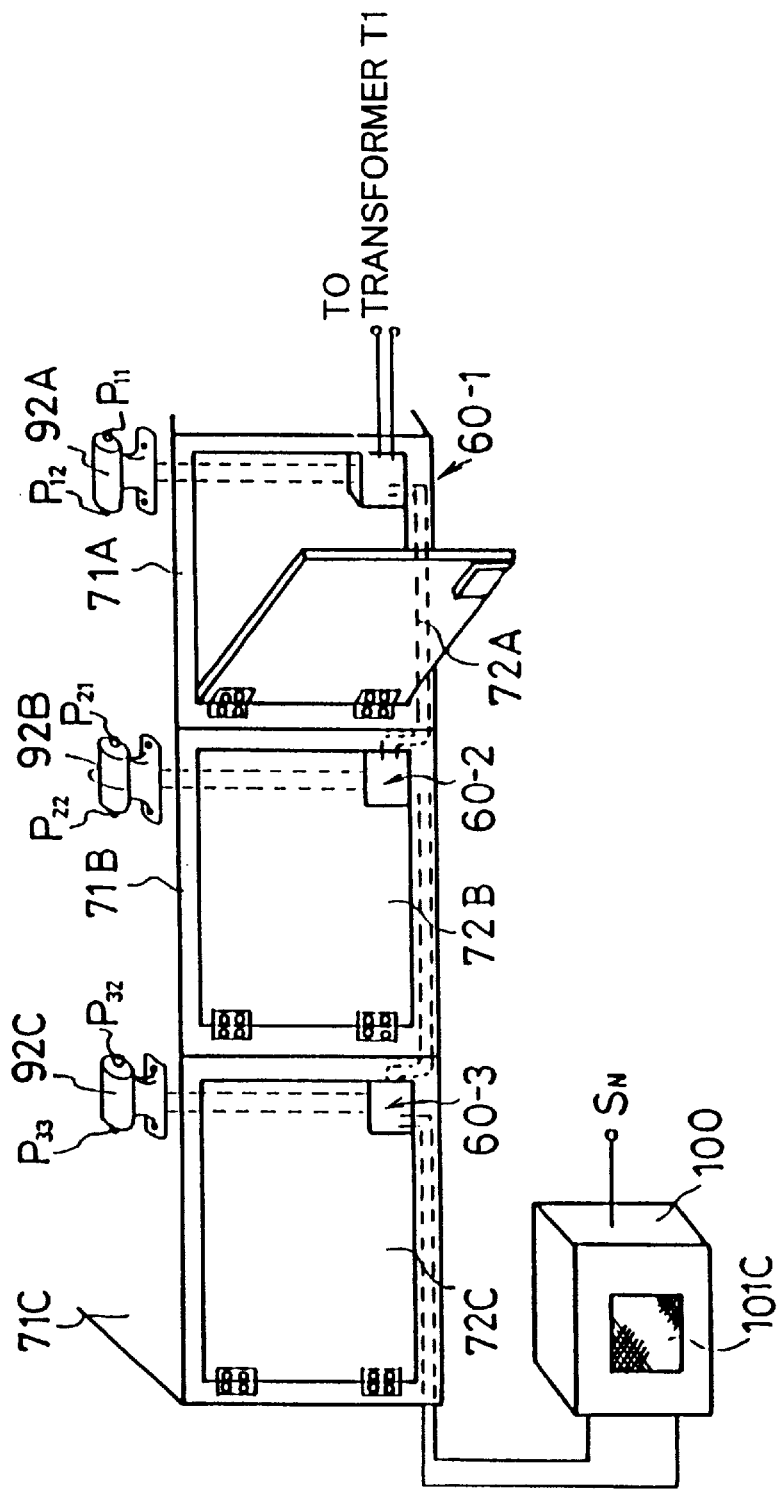
FIG. 17 is a circuit diagram showing an embodiment of a door switch type emergency stop switch circuit which incorporates light emitting elements.

FIG. 17 shows an embodiment for the case where this is applied to the door switch type emergency stop switch circuit of FIG. 10. Here, components the same as in the embodiment of FIG. 10 are denoted by the same symbol and description is omitted.

In FIG. 17, emergency stop switches 60-1~60-3 of the same construction as in FIG. 10 are provided in series connection on respective fixed adjacent safety fences 71A~71C housing respective operating machinery (not shown in the figure). In FIG. 17, symbols 72A~72C denote doors provided with second core members.

With the present embodiment, light emitting elements $P_{11}$, $P_{12}$, $P_{21}$, $P_{22}$, $P_{31}$, $P_{32}$ are connected as in FIG. 12 to the respective secondary winding sides of the first core members of the respective emergency stop switches 60-1~60-3, and are housed in respective cases 92A~92C as shown in FIG. 13, and secured for example to upper faces of the safety fences 71A~72C as shown in FIG. 17. Furthermore, while not shown in the figure, a transformer T1 is connected as in FIG. 12 to the primary winding side of the first stage emergency stop switch 60-1, and an AC signal from an oscillator 41 is applied via the amplifier 91 and the transformer T1. Furthermore, the output signal from the secondary winding of the last stage emergency stop switch 60-3 is input to the operation control circuit 6 and for example an alarm device 100 as shown in FIG. 14 via the transformer T2 and the rectifying circuit 51 as in FIG. 12.

With such a construction, if any one of the emergency stop switches 60-1~60-3 is operated or has a fault, among the light emitting elements $P_{i1}$, $P_{i2}$ (i=1~3) the light emitting element for the work site having the fault is extinguished, thus notifying of the fault. In this case, a warning sound of an audible frequency range is generated from the alarm device 100 in the same manner as for the embodiment of FIG. 12, thus notifying of the occurrence of a fault. Moreover, there is a fail-safe construction as with the embodiment of FIG. 12 with respect to a fault in the light emitting elements $P_{i1}$, $P_{i2}$ (i=1~3) themselves.

Figure 18:
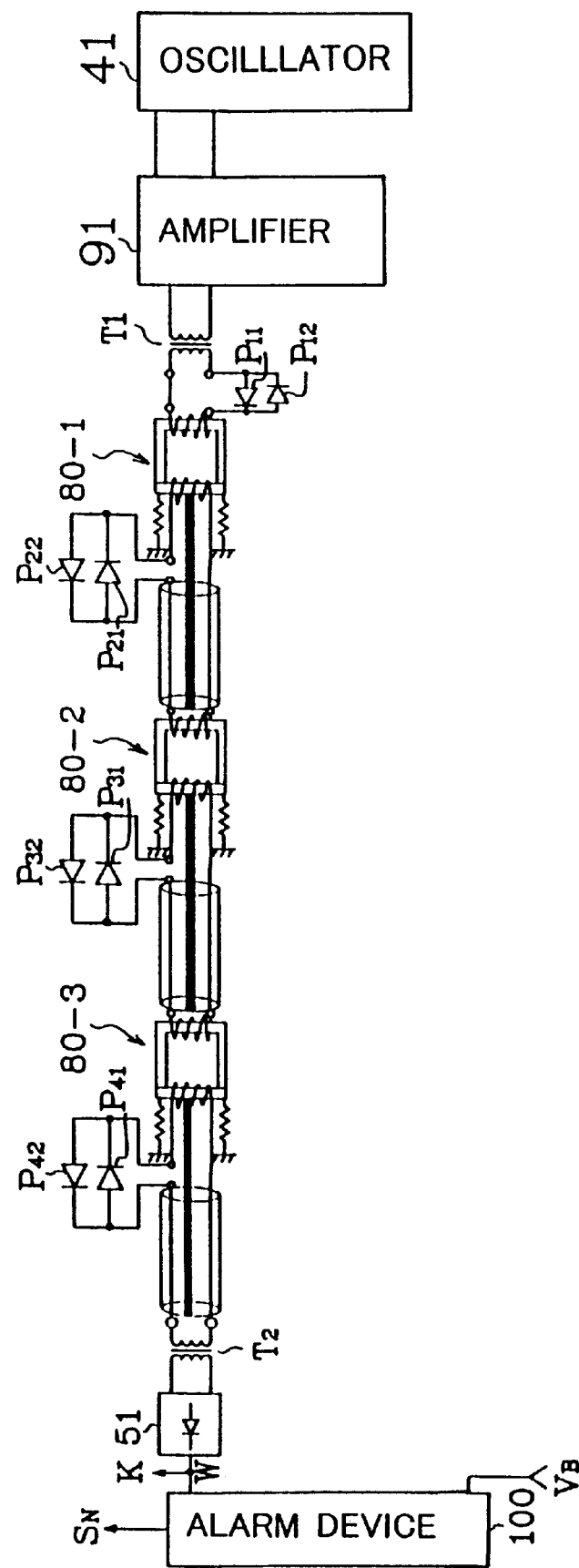
FIG. 18 is a circuit diagram showing an embodiment of a rope switch type emergency stop switch circuit which incorporates light emitting elements.

FIG. 18 shows an example applied to the emergency stop switch circuit of FIG. 11 which uses a rope switch. Components the same as for the embodiment of FIG. 11 are denoted by the same symbols and description is omitted.

In FIG. 18, numerals 80-1~80-3 denote emergency stop switches of the same construction as in FIG. 11, which use a rope. Furthermore, between the transformer T1 and the primary winding side of the first emergency stop switch 80-1, between the adjacent emergency stop switches 80-1 and 80-2 and 80-2 and 80-3, and between the secondary winding side being the output side of the last stage emergency stop switch 80-3 and the transformer T2 is respectively connected in series light emitting elements $P_{11}$, $P_{12}$, $P_{21}$, $P_{22}$, $P_{31}$, $P_{32}$, $P_{41}$, $P_{42}$ provided as pairs in parallel with each other such that respective forward directions are opposite to each other. These light emitting elements $P_{i1}$, $P_{i2}$ (i=1~4) are provided inside cases 92 as shown in FIG. 13, and located at the respective work sites.

With the emergency stop switch circuit of such a construction, a rope is stretched across the boundary of a danger region which is dangerous when an operator enters therein and a safe region which is safe even if an operator is present. When an operator enters the danger region, the rope is pulled so that the rope is stretched and the emergency stop switches are operated so that the output signal K from the rectifying circuit 51 stops, thus stopping the operation output from operation control circuit 6 and stopping the machinery, and also notifying of the danger by means of a warning sound from the alarm device 100.

With this emergency stop switch circuit also, if any of the emergency stop switches 80-1~80-3 has a fault or is operated, among the light emitting elements $P_{i1}$, $P_{i2}$, i=(1~4) the light emitting element for the work site having the fault is extinguished, thus notifying of the fault. Moreover, the fault will be immediately known at the work site. Furthermore, a warning sound of an audible frequency range is generated from the alarm device 100, thus notifying of the occurrence of a fault. Hence fault notification to the operator can be even more reliably carried out.

Figure 19:
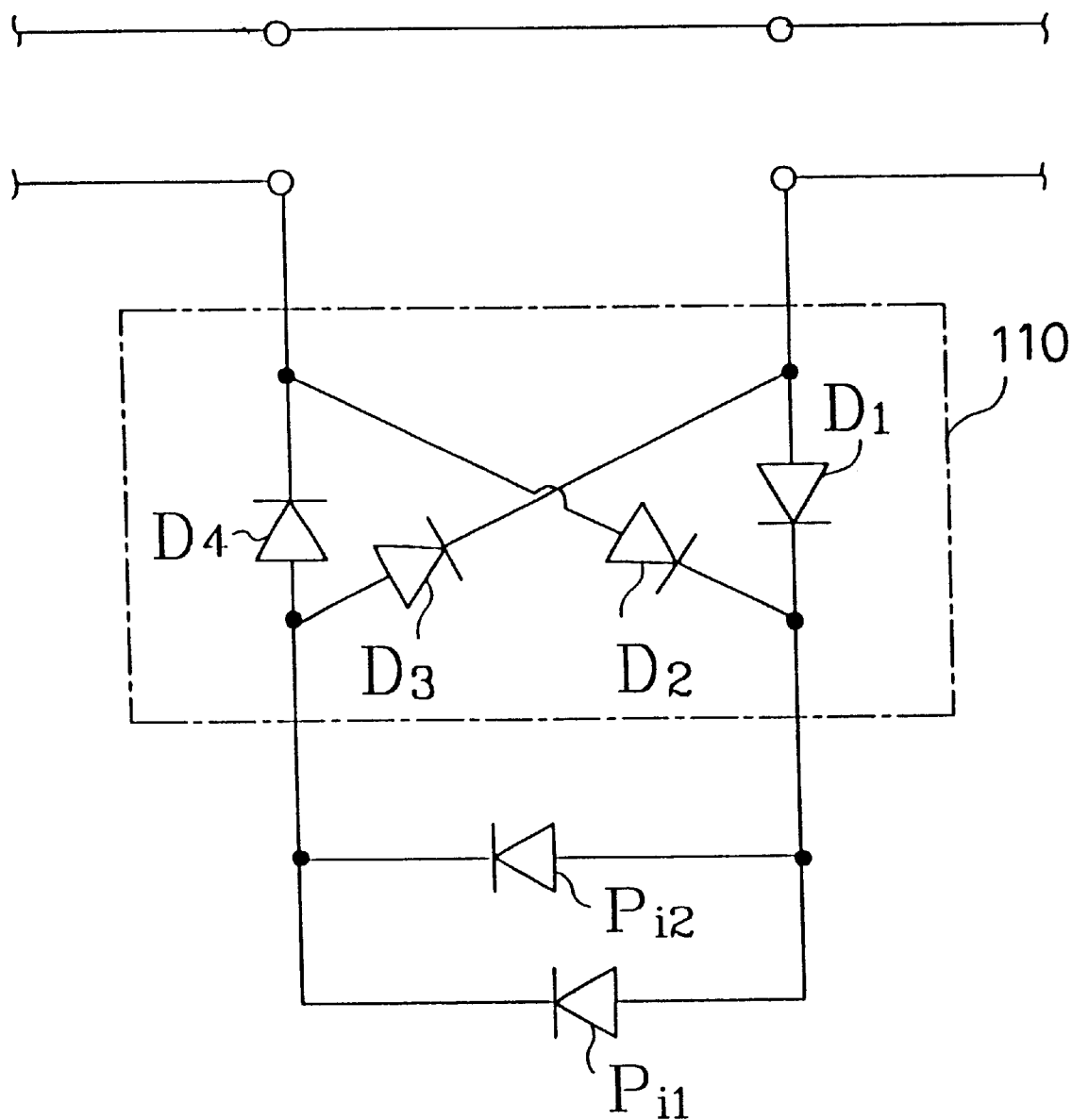
FIG. 19 is a diagram showing another connection example for the light emitting elements connected between the emergency stop switches.

Here, with the respective embodiments, the two light emitting elements $P_{i1}$, $P_{i2}$ are connected in parallel such that their forward directions are opposite to each other, and are connected in series between the respective switches. However as shown in FIG. 19, these may be connected in parallel such that their forward directions are same, and connected to the emergency stop switch circuit via a rectifying circuit 110 comprising four diodes $D_1$~$D_4$. The AC signal flowing in the windings of the respective emergency stop switches is rectified by the rectifying circuit 110 and a DC current is supplied to the light emitting elements $P_{i1}$, $P_{i2}$. In the case where a rectifying circuit is provided in this way, the light emitting elements can be illuminated at normal times. Hence it is unnecessary to provide two light emitting elements, one light emitting element being sufficient.

With the present invention as described above, an emergency stop switch can be made without any contact points, and hence the possibility of a contact point fusion fault such as with a conventional switch using contact points is obviated. Hence the reliability of the switch can be increased and operator safety ensured. Furthermore, even if the emergency stop switch circuit is installed at a work site away from the operating control system, the number of wires for connecting the operating control system to the emergency stop switch circuit can be made much less than heretofore. Hence installation costs and the like can be reduced. Moreover, by interposing a capacitor and a resistor between the respective switches of the emergency stop switch circuit to monitor the capacitance and level of the last output, then faults in the emergency stop switch circuit can be centrally monitored remotely, the reliability of the emergency stop switch circuit can be improved, and operator safety at the time of a switch circuit fault can be ensured.

Furthermore, if light emitting elements are interposed between the respective switches of the emergency stop switch circuit and these are monitored as to whether or not they are illuminated at the respective work sites, then the fact that a switch has faulted can be immediately known at a glance at the work site. Moreover, if at the same time an alarm device is provided, then the occurrence of the fault can also be notified by a warning sound. Hence the occurrence of a fault can be known not only by sight but also by hearing. Consequently, the occurrence of a fault can be more reliably made known. Furthermore, with the alarm device of the present invention, it is also possible to notify of a fault in the alarm device itself, and hence safety can be further improved.

Here, with the emergency stop switch circuit, the invention has been described for a number of series connected emergency stop switches. However needless to say, the invention is not limited to the respective embodiments.
Industrial Field of Applicability The present invention significantly improves the reliability of emergency stop switches and emergency stop switch circuits in which several of these switches are connected, and hence the safety of an operator working in cooperation with machinery at a work site can be ensured. Industrial applicability is thus considerable.

What is claimed is:

1. An emergency stop switch comprising: a first core member secured to a fixed body and wound with a primary winding and a secondary winding, a second core member provided so as to be movable towards and away from said first core member, and moving means for moving said second core member, said emergency stop switch characterized in that, when said second core member is made to approach said first core member by said moving means, a transformer is formed by said first and second core members so that AC signal from an AC signal generating source connected to said primary winding side is transmitted to said secondary winding side, and when said second core member is separated from said first core member by said moving means, said AC signal is not transmitted to said secondary winding side; wherein said moving means comprises; a push button with one end fixed to said second core member, and a resilient member for resiliently urging said second core member in an opposite direction to the push operation direction of said push button, and at normal times, said second core member is made to approach said first core member by the resilient urging force of said resilient member to form a transformer, and when the push button is pushed, said second core member separates from said first core member against the resilient urging force of said resilient member.

2. An emergency stop switch comprising: a first core member secured to a fixed body and wound with a primary winding and a secondary winding, a second core member provided so as to be movable towards and away from said first core member, and moving means for moving said second core member, said emergency stop switch characterized in that, when said second core member is made to approach said first core member by said moving means, a transformer is formed by said first and second core members so that AC signal from an AC signal generating source connected to said primary winding side is transmitted to said secondary winding side, and when said second core member is separated from said first core member by said moving means, said AC signal is not transmitted to said secondary winding side; wherein said moving means is an opening and closing door which is attached to a fixed safety fence, and when the door is closed, said second core member approach said first core member which is fixed to said safety fence side to form a transformer, and when the door is opened, said second core member is separated from said first core member.

3. An emergency stop switch comprising: a first core member secured to a fixed body and wound with a primary winding and a secondary winding, a second core member provided so as to be movable towards and away from said first core member, and moving means for moving said second core member, said emergency stop switch characterized in that, when said second core member is made to approach said first core member by said moving means, a transformer is formed by said first and second core members so that AC signal from an AC signal generating source connected to said primary winding side is transmitted to said secondary winding side, and when said second core member is separated from said first core member by said moving means, said AC signal is not transmitted to said secondary winding side; wherein said moving means comprises; a rope with one end secured to said second core member and the other end secured to a fixed part, and a resilient member for resiliently urging said second core member in a direction opposite to the pulling direction of said rope, and said second core member in a direction opposite to the pulling direction of said rope, and at normal times, said second core member is made to approach said first core member by the resilient urging force of said resilient member to form a transformer, and when said rope is pulled, said second core member separates from said first core member against the resilient urging force of said resilient member.

4. An emergency stop switch circuit comprising: a first core member secured to a fixed body and wound with a primary winding and a secondary winding, a second core member provided so as to be movable towards and away from said first core member, and moving means for moving said second core member, said emergency stop switch characterized in that, when said second core member is made to approach said first core member by said moving means, a transformer is formed by said first and second core members so that AC signal from an AC signal generating source connected to said primary winding side is transmitted to said secondary winding side, and when said second core member is separated from said first core member by said moving means, said AC signal is not transmitted to said secondary winding side; wherein an AC signal is supplied from an AC signal generating source to a primary winding side of a first stage emergency stop switch, and an output based on said AC signal is generated from a secondary winding side of a last stage emergency stop switch.

5. An emergency stop switch circuit according to claim 4, wherein respective capacitors are connected in parallel between adjacent emergency stop switches, and capacitance detection means for detecting capacitor capacitance is connected in parallel to an output end of the secondary winding side of the last stage emergency stop switch.

6. An emergency stop switch circuit according to claim 5, wherein said capacitor is a four terminal capacitor.

7. An emergency stop switch circuit according to claim 4, wherein respective resistors are connected in series between the adjacent emergency stop switches, and level detection means is provided for detecting the level of the output signal from an output end of said last stage emergency stop switch, and when the level of said output signal exceeds a previously set threshold value level, the output from said level detection means is stopped.

8. An emergency stop switch circuit according to claim 4, wherein instead of resistors connected in series between the adjacent emergency stop switches, a tertiary winding is wound on said second core member of the respective emergency stop switches, and said resistors are connected in series to said tertiary winding.

9. An emergency stop switch circuit according to claim 4, wherein light emitting elements are respectively connected in series to at least the secondary winding sides of the respective emergency stop switches which are connected together in series.

10. An emergency stop switch circuit according to claim 9, wherein a parallel circuit in which two light emitting elements are connected in parallel with their forward directions opposite to each other, is connected to said secondary winding side.

11. An emergency stop switch circuit according to claim 9, wherein one light emitting element is connected to said secondary winding side via a rectifying circuit.

12. An emergency stop switch circuit according to claim 9, comprising: a warning sound generating circuit provided with an alarm device into which is input an output signal from said last stage emergency stop switch, said alarm device generating a warning sound in an inaudible frequency range when an output signal is generated from said last stage emergency stop switch and a high level signal indicating safety is thus input, and generating a warning sound in an audible frequency range when said output signal is stopped and a low level signal indicating danger is thus input; and a monitoring circuit for continuously monitoring for the presence of a warning sound from said warning sound generating circuit.

13. An emergency stop switch circuit according to claim 12, wherein said warning sound generating circuit comprises: a voltage-frequency converter which generates an audible frequency signal when a low level voltage signal is input, and generates an inaudible frequency signal when a high level voltage signal is input; an amplifier for amplifying an output signal from said voltage-frequency converter; and a speaker for generating a warning sound based on an output signal from said amplifier, and said monitoring circuit comprises; a current sensor for detecting an input current to said speaker, an amplifier for amplifying an output from said current sensor, and a rectifying circuit for rectifying an output from said amplifier.

14. An emergency stop switch circuit according to claim 13, wherein said voltage-frequency converter takes the input of the output signal from said last stage emergency stop switch and a previously input bias voltage, and makes the sum of the voltage level of said output signal and said bias voltage an input voltage level, and generates an output signal of a frequency corresponding to said input voltage level.

* * * * *